(12) United States Patent
Lu et al.

(10) Patent No.: US 12,080,751 B2
(45) Date of Patent: Sep. 3, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Hsueh-Han Lu, Tainan (TW); Kun-Ei Chen, Tainan (TW); Chen-Chieh Chiang, Kaohsiung (TW); Ling-Sung Wang, Tainan (TW); Jun-Nan Nian, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 253 days.

(21) Appl. No.: 17/742,452

(22) Filed: May 12, 2022

(65) Prior Publication Data

US 2023/0369386 A1 Nov. 16, 2023

(51) Int. Cl.
| | |
|---|---|
| *H01L 49/02* | (2006.01) |
| *H01L 21/3115* | (2006.01) |
| *H01L 21/768* | (2006.01) |
| *H01L 21/822* | (2006.01) |
| *H01L 27/06* | (2006.01) |
| H01L 21/8234 | (2006.01) |

(52) U.S. Cl.
CPC .......... *H01L 28/24* (2013.01); *H01L 21/3115* (2013.01); *H01L 21/76822* (2013.01); *H01L 21/76825* (2013.01); *H01L 21/8221* (2013.01); *H01L 27/0629* (2013.01); *H01L 27/0688* (2013.01); *H01L 21/823431* (2013.01)

(58) Field of Classification Search
CPC ................. H01L 28/24; H01L 21/3115; H01L 21/76822; H01L 21/76825
See application file for complete search history.

(56) References Cited

U.S. PATENT DOCUMENTS 9,362,230 B1 * 6/2016 Clevenger ......... H01L 21/28562

FOREIGN PATENT DOCUMENTS

| TW | I730099 B | 6/2021 |
|---|---|---|
| TW | I742146 B | 10/2021 |
| TW | 202145359 A | 12/2021 |
| TW | 202201822 A | 1/2022 |

* cited by examiner

*Primary Examiner* — John A Bodnar
(74) *Attorney, Agent, or Firm* — NZ CARR LAW OFFICE

(57) ABSTRACT

Semiconductor device structure and methods of forming the same are described. The structure includes a first dielectric layer including a first portion disposed over a source/drain region in an active region of a substrate and a modulation portion over an interlayer dielectric (ILD) in a resistor region of the substrate, the first portion of the first dielectric layer has a first composition, and the modulation portion of the first dielectric layer has a second composition different from the first composition. The structure further includes a resistor layer disposed on the modulation portion of the first dielectric layer in the resistor region and a second dielectric layer disposed over the first dielectric layer in the active region and over the resistor layer in the resistor region.

20 Claims, 23 Drawing Sheets

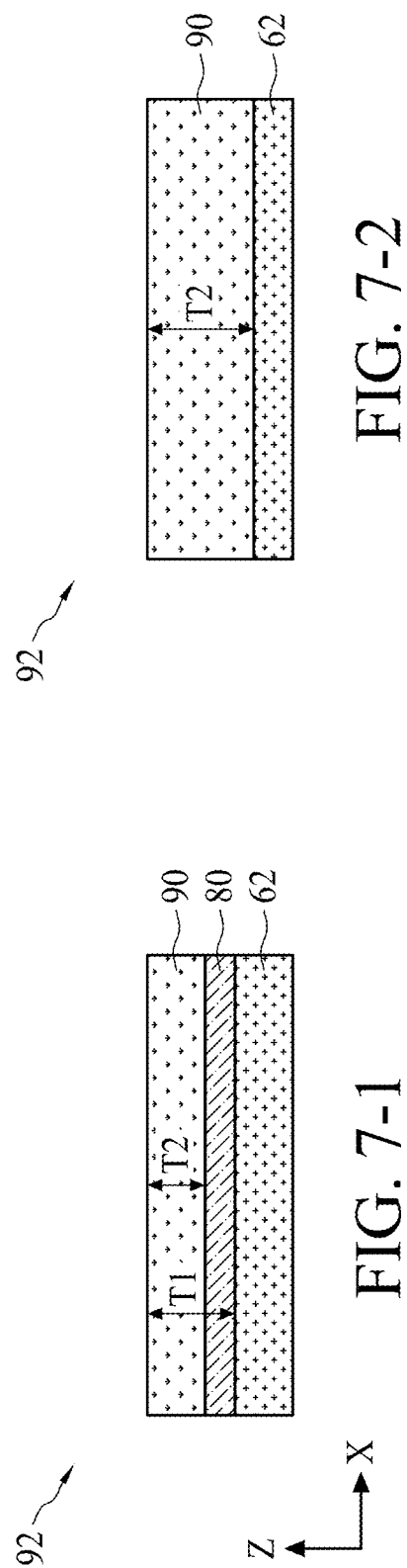

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generation of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
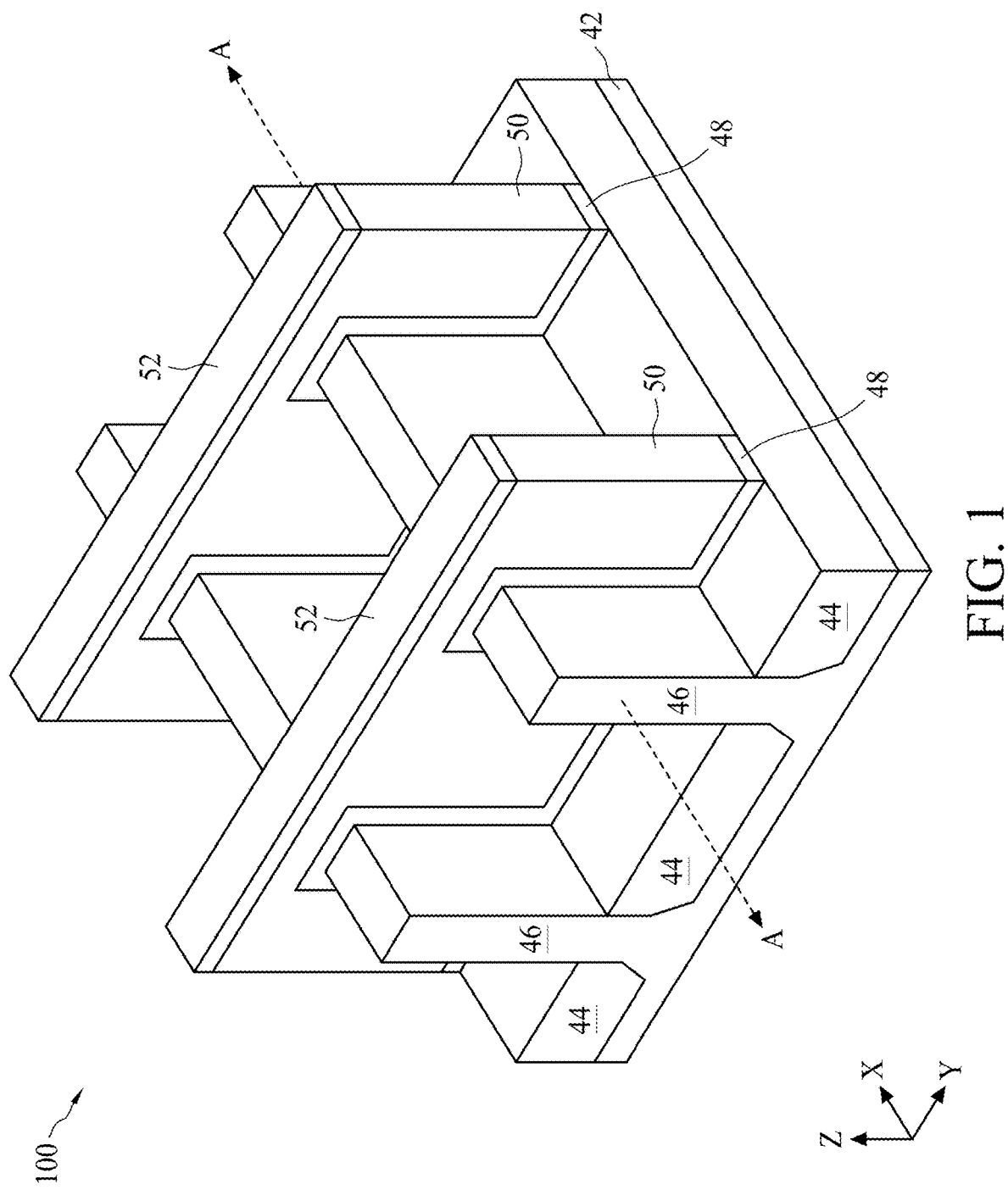
FIG. 1 is a perspective view of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to conductive features, such as metal contacts, vias, lines, etc., and methods for forming those conductive features. Example embodiments described herein are described in the context of forming conductive features in middle of the line (MOL) processing for a fin field effect transistor (FinFET). Other embodiments may be implemented in other contexts, such as forming conductive features in back end of the line (BEOL), or with different devices, such as planar field effect transistors (FETs), vertical gate all around (VGAA) FETs, horizontal gate all around (HGAA) FETs, bipolar junction transistors (BJTs), diodes, capacitors, inductors, resistors, etc. Implementations of some aspects of the present disclosure may be used in other processes and/or in other devices.

Some variation of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIGS. 1 through 13 illustrate views of respective semiconductor device structure 100 at respective stages during an example method for forming conductive features in accordance with some embodiments. FIG. 1 illustrates a perspective view of the semiconductor device structure at a stage of the example method. The semiconductor device structure 100, as described in the following, is used in the implementation of FinFETs. Other structures may be implemented in other example embodiments.

The semiconductor device structure 100 includes first and second fins 46 formed on a semiconductor substrate 42, with respective isolation regions 44 on the semiconductor substrate 42 between neighboring fins 46. First and second dummy gate stacks are along respective sidewalls of and over the fins 46. The first and second dummy gate stacks each include an interfacial dielectric 48, a dummy gate 50, and a mask 52.

The semiconductor substrate 42 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 42 may include an elemental semiconductor such as silicon (Si) or germanium (Ge); a compound semiconductor; an alloy semiconductor; or a combination thereof.

The fins 46 are formed in the semiconductor substrate 42. For example, the semiconductor substrate 42 may be etched, such as by appropriate photolithography and etch process, such that trenches are formed between neighboring pairs of fins 46 and such that the fins 46 protrude from the semiconductor substrate 42. Isolation regions 44 are formed with each being in a corresponding trench. The isolation regions 44 may include or be an insulating material such as an oxide (such as silicon oxide), a nitride, the like, or a combination thereof. The insulating material may then be recessed after being deposited to form the isolation regions 44. The insulating material is recessed using an acceptable etch process such that the fins 46 protrude from between neighboring isolation regions 44, which may, at least in part, thereby delineate the fins 46 as active areas on the semiconductor substrate 42. The fins 46 may be formed by other processes, and may include homoepitaxial and/or heteroepitaxial structures, for example.

The dummy gate stacks are formed on the fins 46. In a replacement gate process as described herein, the interfacial dielectrics 48, dummy gates 50, and masks 52 for the dummy gate stacks may be formed by sequentially forming respective layers by appropriate deposition processes, for example, and then patterning those layers into the dummy gate stacks by appropriate photolithography and etch processes. For example, the interfacial dielectrics 48 may include or be silicon oxide, silicon nitride, the like, or multilayers thereof. The dummy gates 50 may include or be silicon (e.g., polysilicon) or another material. The masks 52 may include or be silicon nitride, silicon oxynitride, silicon carbon nitride, the like, or a combination thereof.

In other examples, instead of and/or in addition to the dummy gate stacks, the gate stacks can be operational gate stacks (or more generally, gate structures) in a gate-first process. In a gate-first process, the interfacial dielectric 48 may be a gate dielectric layer, and the dummy gate 50 may be a gate electrode. The gate dielectric layers, gate electrodes, and masks 52 for the operational gate stacks may be formed by sequentially forming respective layers by appropriate deposition processes, and then patterning those layers into the gate stacks by appropriate photolithography and etch processes. For example, the gate dielectric layers may include or be silicon oxide, silicon nitride, a high-k dielectric material, the like, or multilayers thereof. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate electrodes may include or be silicon (e.g., polysilicon, which may be doped or undoped), a metal-containing material (such as titanium, tungsten, aluminum, ruthenium, or the like), a combination thereof (such as a silicide (which may be subsequently formed), or multiple layers thereof. The masks 52 may include or be silicon nitride, silicon oxynitride, silicon carbon nitride, the like, or a combination thereof.

Figure 2:
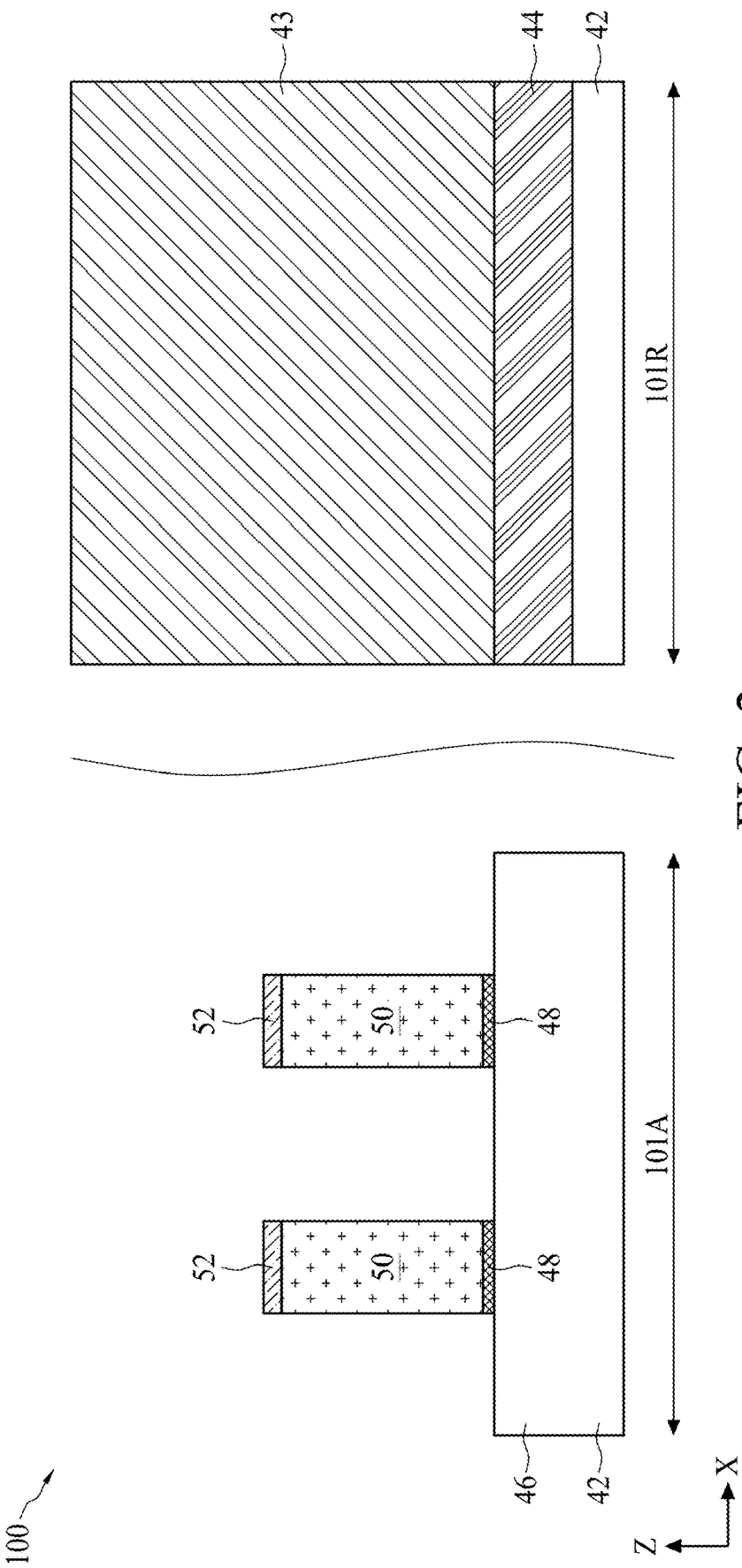
FIGS. 2-13 are cross-sectional side views of various stages of manufacturing the semiconductor device structure of FIG. 1 taken along cross-section A-A, in accordance with some embodiments.

FIG. 1 further illustrates a reference cross-section that is used in later figures. Cross-section A-A is in a plane along, e.g., channels in the fin 46 between opposing source/drain regions. The FIGS. 2 through 13 illustrate cross-sectional views at various stages of processing in various example methods corresponding to cross-section A-A. FIG. 2 illustrates a cross-sectional view of the semiconductor device structure 100 of FIG. 1 at the cross-section A-A. As shown in FIG. 2, portions of the semiconductor device structure 100 disposed over different regions of the semiconductor substrate 42. For example, the portion of the semiconductor device structure 100 shown on the left is an active region 101A, while the portion of the semiconductor device structure 100 shown on the right is a resistor region 101R. The resistor region 101R is not shown in FIG. 1. As shown in FIG. 2, the isolation region 44 is disposed on the semiconductor substrate 42, and no fins 46 and dummy gate 50 are formed in the resistor region 101R. A mask 43 is disposed on the isolation region 44.

Figure 3:
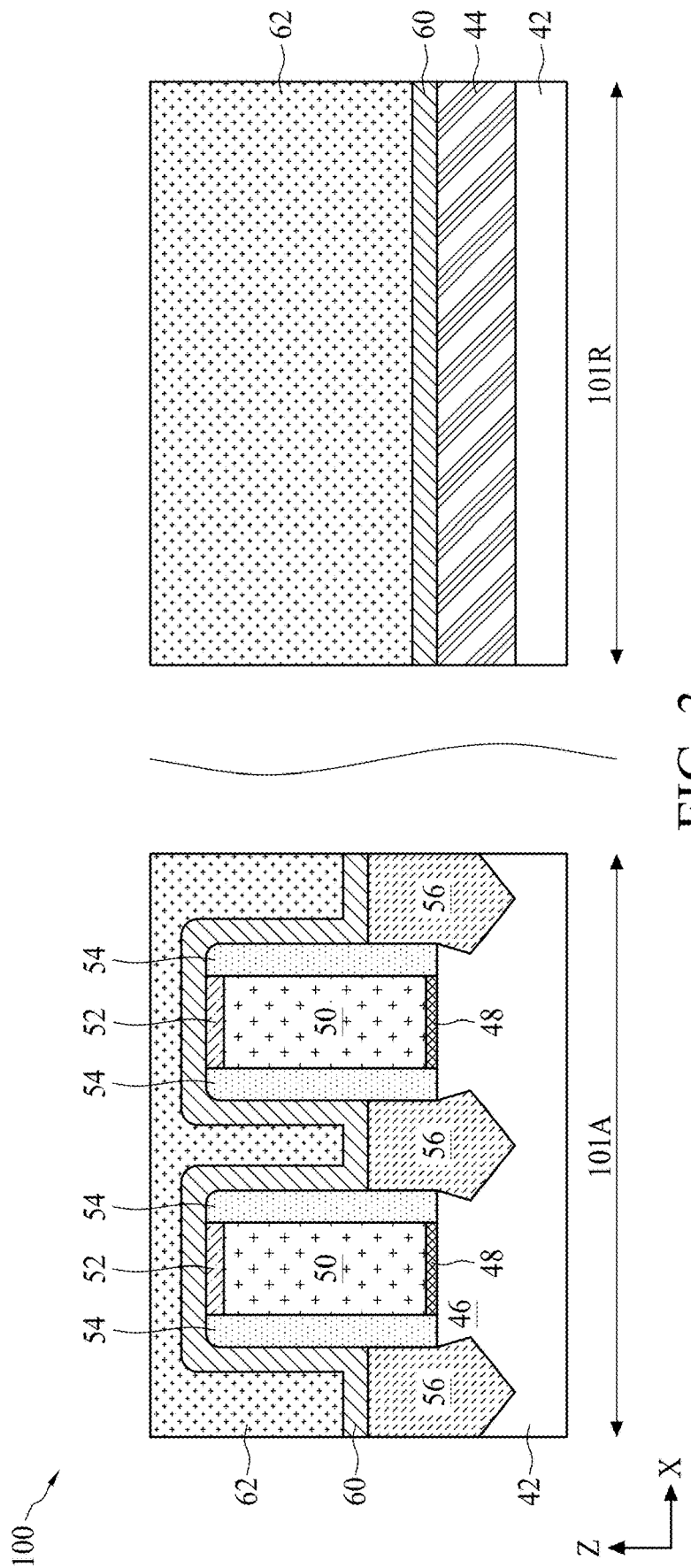

FIG. 3 illustrates the formation of gate spacers 54 and epitaxy source/drain regions 56 in the active region 101A and the formation of a contact etch stop layer (CESL) 60 and a first interlayer dielectric (ILD) 62 in the active region 101A and the resistor region 101R. Gate spacers 54 are formed along sidewalls of the dummy gate stacks (e.g., sidewalls of the interfacial dielectrics 48, dummy gates 50, and masks 52) and over the fins 46 in the active region 101A. The gate spacers 54 may be formed by conformally depositing, by an appropriate deposition process, one or more layers for the gate spacers 54 and anisotropically etching the one or more layers, for example. The one or more layers for the gate spacers 54 may include or be silicon oxygen carbide, silicon nitride, silicon oxynitride, silicon carbon nitride, the like, multi-layers thereof, or a combination thereof. The portion of the gate spacers 54 formed on the mask 43 in the resistor region 101R is removed by the anisotropic etching process.

Recesses are then formed in the fins 46 on opposing sides of the dummy gate stacks (e.g., using the dummy gate stacks and gate spacers 54 as a mask) by an etch process in the active region 101A. The mask 43 is not substantially affected by the etch process in the resistor region 101R. The etch process can be isotropic or anisotropic, or further, may be selective with respect to one or more crystalline planes of the semiconductor substrate 42. Hence, the recesses can have various cross-sectional profiles based on the etch process implemented. The epitaxy source/drain regions 56 are formed in the recesses. The epitaxy source/drain regions 56 may include or be silicon germanium, silicon carbide, silicon phosphorus, silicon carbon phosphorus, pure or substantially pure germanium, a III-V compound semiconductor, a II-VI compound semiconductor, or the like. The epitaxy source/drain regions 56 may be formed in the recesses by an appropriate epitaxial growth or deposition process. In some examples, epitaxy source/drain regions 56 can be raised with respect to the fin 46, and can have facets, which may correspond to crystalline planes of the semiconductor substrate 42.

A person having ordinary skill in the art will also readily understand that the recessing and epitaxial growth may be omitted, and that source/drain regions may be formed by implanting dopants into the fins 46 using the dummy gate stacks and gate spacers 54 as masks. In some examples where epitaxy source/drain regions 56 are implemented, the epitaxy source/drain regions 56 may also be doped, such as by in situ doping during epitaxial growth and/or by implanting dopants into the epitaxy source/drain regions 56 after epitaxial growth. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

After the formation of the epitaxy source/drain regions 56, the mask 43 in the resistor region 101R is removed. The removal of the mask 43 may be performed by any suitable process, such as dry etch, wet etch, a combination thereof, or other suitable process. The removal of the mask 43 may be a selective process that does not substantially affect the exposed materials in the active region 101A. The isolation region 44 is exposed in the resistor region 101R after the removal of the mask 43.

The CESL 60 is conformally deposited, by an appropriate deposition process, on surfaces of the epitaxy source/drain regions 56, sidewalls and top surfaces of the gate spacers 54, top surfaces of the masks 52, and top surfaces of the isolation regions 44 in the active region 101A and the resistor region 101R. Generally, an etch stop layer (ESL) can provide a mechanism to stop an etch process when forming, e.g., contacts or vias. An ESL may be formed of a dielectric material having a different etch selectively from adjacent layers or components. The CESL 60 may include or be silicon nitride, silicon carbon nitride, silicon carbon oxide, carbon nitride, the like, or a combination thereof.

The first ILD 62 is deposited, by an appropriate deposition process, on the CESL 60 in the active region 101A and the resistor region 101R, as shown in FIG. 3. The first ILD 62 may include or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, spin-on-glass, spin-on-polymers, silicon carbon material, a compound thereof, a composite thereof, the like, or a combination thereof.

The first ILD 62 may be planarized after being deposited, such as by a chemical mechanical polishing (CMP). In a gate-first process, a top surface of the first ILD 62 may be above the upper portions of the CESL 60 and the gate stacks, and processing described below with respect to FIGS. 4 and 5 may be omitted. Hence, the upper portions of the CESL 60 and first ILD 62 may remain over the gate stacks in the active region 101A.

Figure 4:
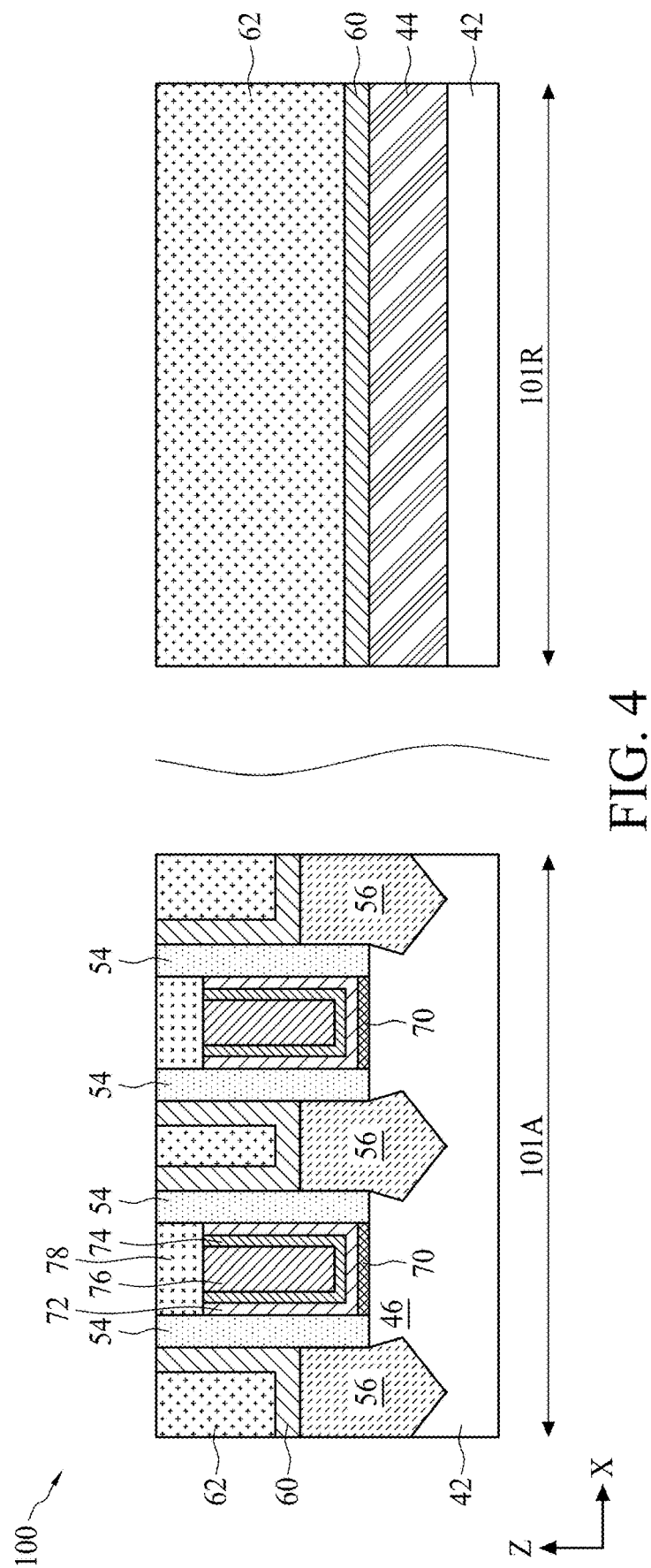

FIG. 4 illustrates the replacement of the dummy gate stacks with replacement gate structures in the active region 101A. A planarization process, such as a CMP, may be performed to level the top surfaces of the first ILD 62 and CESL 60 with the top surfaces of the dummy gates 50 in the active region 101A. The CMP may also remove the masks 52 (and, in some instances, upper portions of the gate spacers 54) on the dummy gates 50. Accordingly, top surfaces of the dummy gates 50 are exposed through the first ILD 62 and the CESL 60.

With the dummy gates 50 exposed through the first ILD 62 and the CESL 60, the dummy gates 50 are removed, such as by one or more etch processes. The dummy gates 50 may be removed by an etch process selective to the dummy gates 50, where the interfacial dielectrics 48 act as ESLs, and subsequently, the interfacial dielectrics 48 can optionally be removed by a different etch process selective to the interfacial dielectrics 48. Recesses are formed between gate spacers 54 where the dummy gate stacks are removed, and channel regions of the fins 46 are exposed through the recesses. The one or more etch processes do not substantially affect the first ILD 62, the etch stop layer 60, and the gate spacers 54.

The replacement gate structures are formed in the recesses where the dummy gate stacks were removed in the active region 101A. The replacement gate structures each include, as illustrated, an interfacial dielectric 70, a gate dielectric layer 72, one or more optional conformal layers 74, and a gate conductive fill material 76. The interfacial dielectric 70 is formed on sidewalls and top surfaces of the fins 46 along the channel regions. The interfacial dielectric 70 can be, for example, the interfacial dielectric 48 if not removed, an oxide (e.g., silicon oxide) formed by thermal or chemical oxidation of the fin 46, and/or an oxide (e.g., silicon oxide), nitride (e.g., silicon nitride), and/or another dielectric layer.

The gate dielectric layer 72 can be conformally deposited in the recesses where dummy gate stacks were removed (e.g., on top surfaces of the isolation regions 44, on the interfacial dielectric 70, and sidewalls of the gate spacers 54) and on the top surfaces of the first ILD 62, the CESL 60, and gate spacers 54. The gate dielectric layer 72 can be or include silicon oxide, silicon nitride, a high-k dielectric material (examples of which are provided above), multilayers thereof, or other dielectric material.

Then, the one or more optional conformal layers 74 can be conformally (and sequentially, if more than one) deposited on the gate dielectric layer 72. The one or more optional conformal layers 74 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

A layer for the gate conductive fill material 76 is formed over the one or more optional conformal layers 74 (e.g., over the one or more work-function tuning layers), if implemented, and/or the gate dielectric layer 72. The layer for the gate conductive fill material 76 can fill remaining recesses where the dummy gate stacks were removed. The layer for the gate conductive fill material 76 may be or include a metal-containing material such as tungsten, cobalt, aluminum, ruthenium, copper, multi-layers thereof, a combination thereof, or the like. Portions of the layer for the gate conductive fill material 76, one or more optional conformal layers 74, and gate dielectric layer 72 above the top surfaces of the first ILD 62, the CESL 60, and gate spacers 54 in the active region 101A and above the top surface of the first ILD 62 in the resistor region 101R are removed, such as by a CMP. The replacement gate structures including the gate conductive fill material 76, one or more optional conformal layers 74, gate dielectric layer 72, and interfacial dielectric 70 may therefore be formed as illustrated in FIG. 4.

After the CMP process, portions of the gate dielectric layer 72, the one or more optional conformal layers 74, and the gate conductive fill material 76 may be recessed, and a cap 78 is formed on the recessed gate dielectric layer 72, the one or more optional conformal layers 74, and the gate conductive fill material 76. The cap 78 may include any suitable dielectric material. In some embodiments, the cap 78 includes SiN. The portions of the cap 78 formed on the first ILD 62, the CESL 60, and the gate spacers 54 in the active region 101A and on the first ILD 62 in the resistor region 101R may be removed by a planarization process, such as a CMP process.

Figure 5:
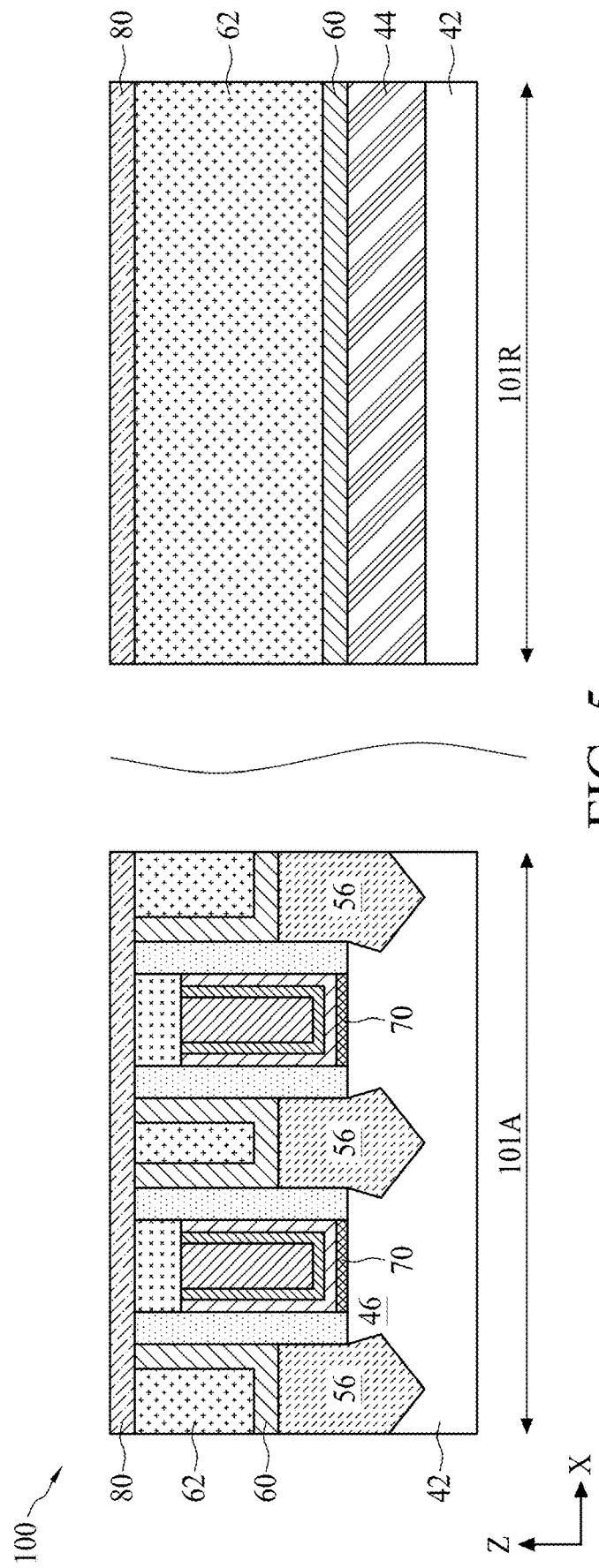

FIG. 5 illustrates the formation of a dielectric layer 80 over the first ILD 62, CESL 60, gate spacers 54, and replacement gate structures in the active region 101A and over the first ILD 62 in the resistor region 101R. The dielectric layer 80 may include or be silicon dioxide, a low-k dielectric material, silicon oxynitride, PSG, BSG, BPSG, USG, FSG, OSG, $SiO_xC_y$, spin-on-glass, spin-on-polymers, silicon carbon material, a compound thereof, a composite thereof, the like, or a combination thereof. In some embodiments, the dielectric layer 80 includes plasma enhanced oxide, such as silicon oxide. In some embodiments, the dielectric layer 80 includes silicon and oxygen, and the oxygen concentration of the dielectric layer 80 is substantially greater than the silicon concentration of the dielectric layer 80. In some embodiments, the dielectric layer 80 includes the same material as the first ILD 62.

Figure 6:
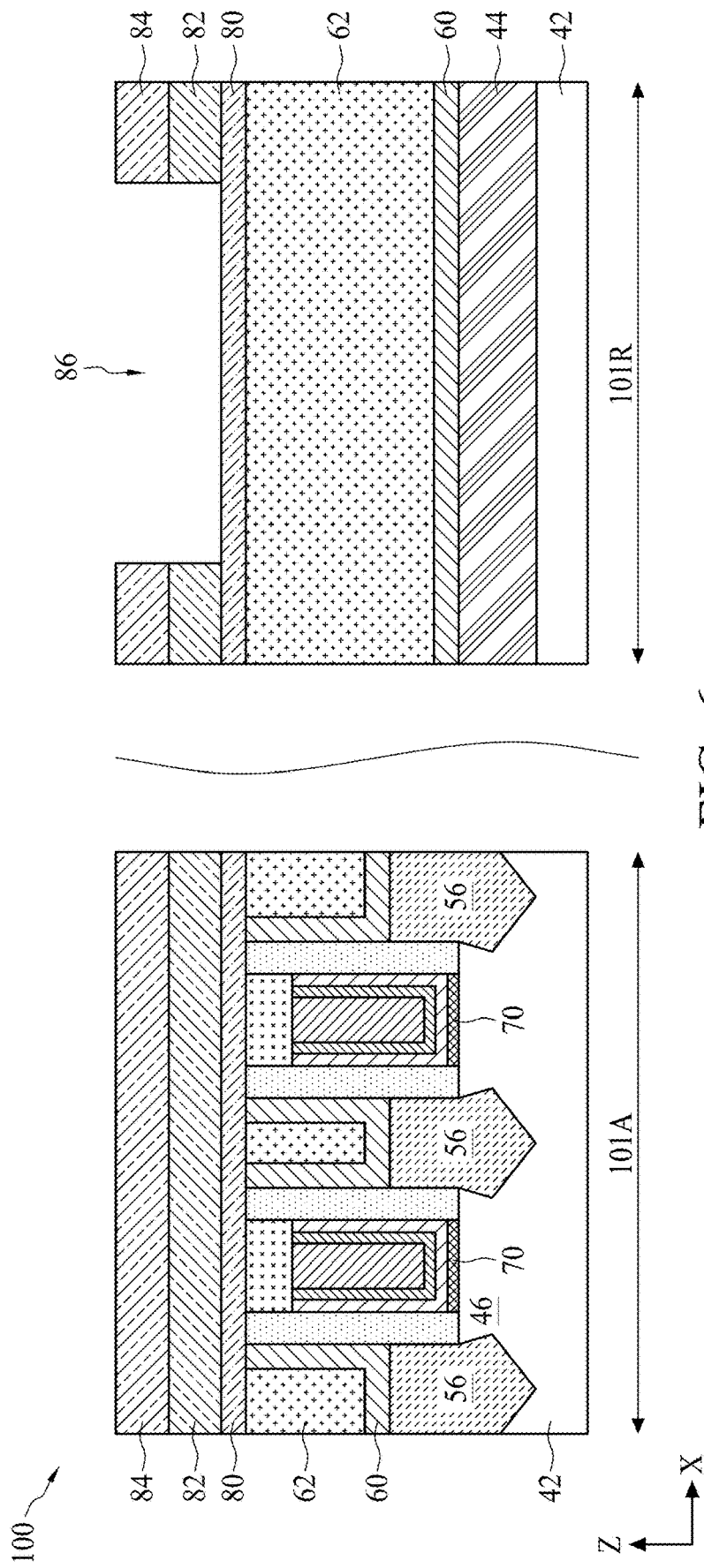

As shown in FIG. 6, a mask layer 82 is formed on the dielectric layer 80 in the active region 101A and the resistor region 101R, and a photoresist layer 84 is formed on the mask layer 82 in the active region 101A and the resistor region 101R. The mask layer 82 may be a bottom antireflective coating (BARC) layer. An opening 86 is formed in the photoresist layer 84 and the mask layer 82 in the resistor region 101R to expose a portion of the dielectric layer 80 in the resistor region 101R.

Figure 7:
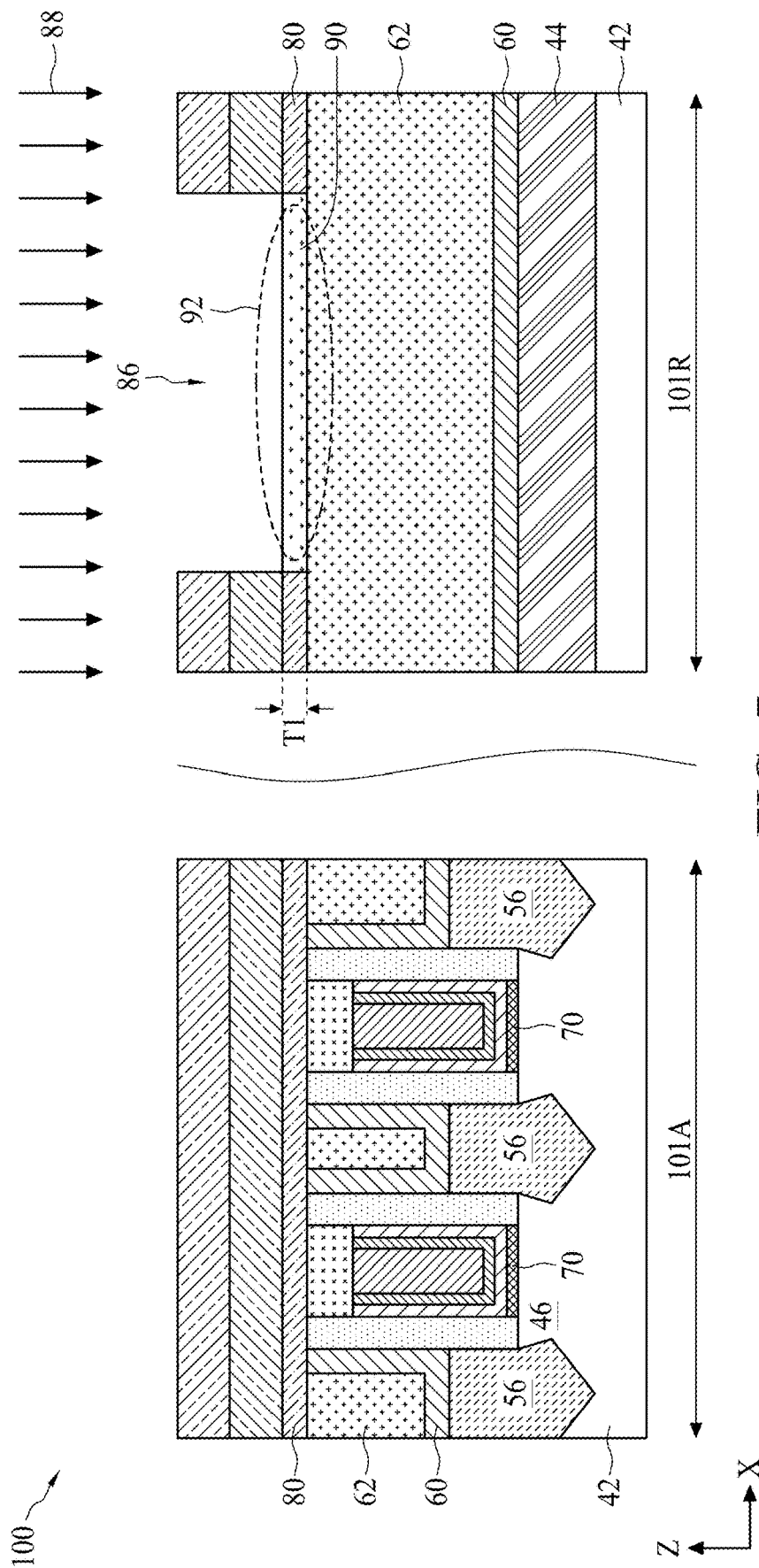

As shown in FIG. 7, an implantation process 88 is performed and a dopant is implanted in the exposed portion of the dielectric layer 80 to form a modulation portion 90 of the dielectric layer 80. The dopant may include silicon, oxygen, germanium, carbon, nitrogen, phosphorous, or other suitable dopant. In some embodiments, the dielectric layer 80 includes $SiO_2$, and the dopant is oxygen. By increasing the oxygen to silicon ratio of the dielectric layer 80, the crystallinity of the resistor layer 94 (FIG. 8) is improved, which leads to reduced resistance of the resistor layer 94. In some embodiments, the dielectric layer 80 includes $SiO_2$, and the dopant is silicon. By reducing the oxygen to silicon ratio of the dielectric layer 80, the crystallinity of the resistor layer 94 (FIG. 8) is worsened, which leads to increased resistance of the resistor layer 94. Thus, in some embodiments, the dielectric 80 includes a portion disposed in the active region 101A having a first oxygen to silicon ratio and the modulation portion 90 disposed in the resistor region 101R having a second oxygen to silicon ratio different from the first oxygen to silicon ratio. The second oxygen to silicon ratio may be substantially less or greater than the first oxygen to silicon ratio. In some embodiments, the dopant is oxygen-free, and the crystallinity of the resistor layer 94 is worsened. By implanting the dielectric layer 80 with a dopant, the resistance of the resistor layer 94 formed on the doped dielectric layer 80 (i.e., the modulation portion 90) can be modulated due to a change in the crystallinity of the resistor layer 94. For example, instead of changing the size of the resistor layer 94 to change the resistance of the resistor layer 94, the resistance of the resistor layer 94 may be changed by doping the dielectric layer 80 with a dopant.

The implantation process 88 may be an example of how to introduce the dopant into the dielectric layer 80. Other processes may be utilized to introduce the dopant into the dielectric layer 80. In some embodiments, a dopant-rich layer (not shown) is formed on the exposed portion of the dielectric layer 80, and the dopant in diffused into the exposed portion of the dielectric layer 80 from the dopant-rich layer. The dopant-rich layer may be a conformal layer or may fill the opening 86. The dopant may be diffused into the exposed portion of the dielectric layer 80 by any suitable method, such as thermal diffusion, ALD diffusion, or wet diffusion. In some embodiments, the exposed portion of the dielectric layer 80 is removed to expose a portion of the first ILD 62, and a modulation layer (not shown) is formed on the exposed portion of the first ILD 62. The modulation layer may include the same composition as the modulation portion 90 of the dielectric layer 80. The modulation portion 90 (or the modulation layer) may include at least one atomic percent of the dopant, as a result of the processes described above. The modulation portion 90 includes a first composition, and the portion of the dielectric layer 80 disposed in the active region 101A includes a second composition different from the first composition.

In some embodiments, as shown in FIG. 7, the modulation portion 90 has the same thickness as the dielectric layer 80. For example, the dielectric layer 80 and the modulation portion 90 each has a thickness T1 ranging from about 1 nm to about 50 nm. FIGS. 7-1 and 7-2 show an enlarged portion 92 of the semiconductor device structure 100. In some embodiments, as shown in FIG. 7-1, the dopant did not diffuse through the entire thickness of the dielectric layer 80, and the modulation portion 90 has a thickness T2 substantially less than the thickness T1. In some embodiments, the thickness T2 ranges from about 1 nm to about 14 nm. In some embodiments, as shown in FIG. 7-2, the dopant diffuses through the dielectric layer 80 and into a portion of the first ILD 62, and the thickness T2 of the modulation portion 90 is substantially greater than the thickness T1.

Figure 8:
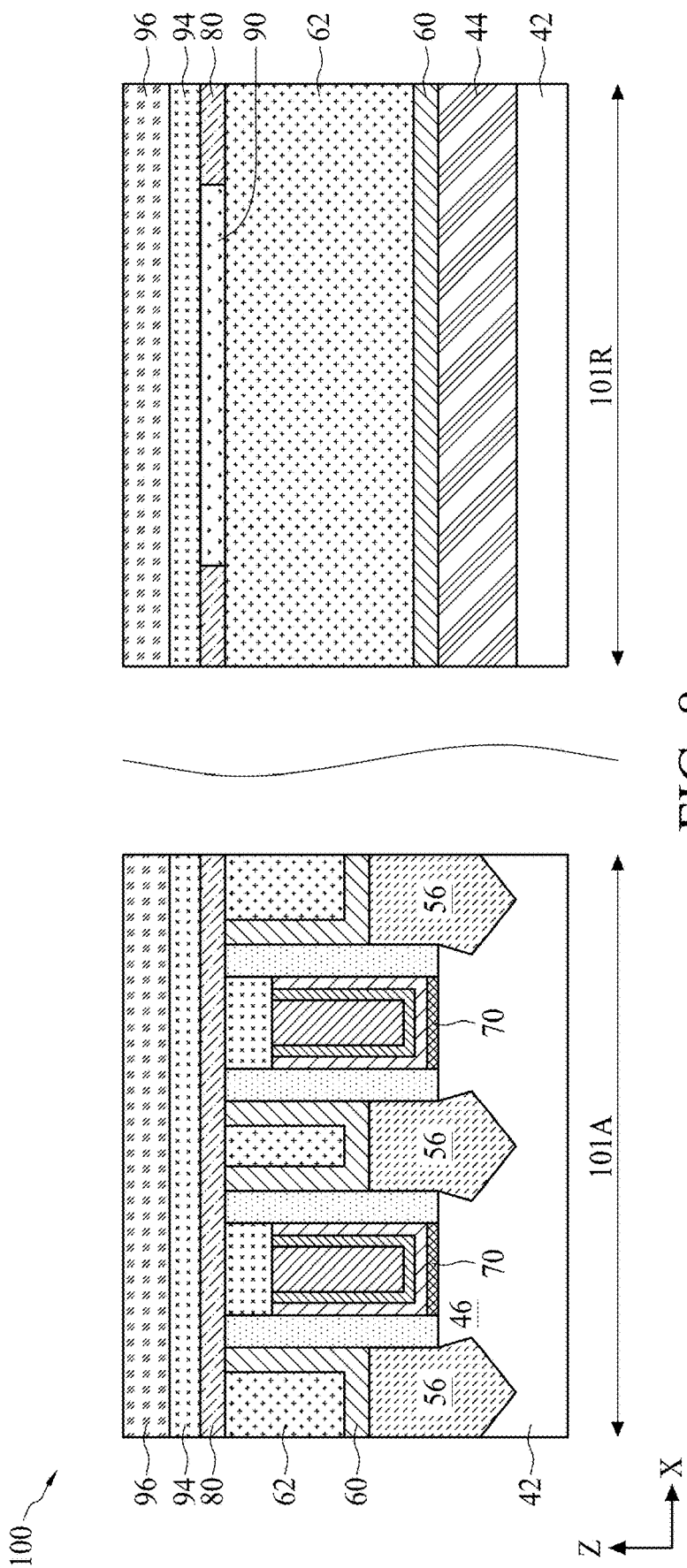

As shown in FIG. 8, the resistor layer 94 is formed on the dielectric layer 80 in the active region 101A and on the dielectric layer 80 and the modulation portion 90 in the resistor region 101R, and a mask layer 96 is formed on the resistor layer in the active region 101A and the resistor region 101R. The resistor layer 94 includes an electric conductive material, such as TiN, Ti, TaN, Ta, or other suitable material. The resistor layer 94 may be formed by any suitable method, such as PVD, CVD, or ALD. In some embodiments, the resistor layer 94 is a conformal layer formed by ALD. As described above, the electrical resistance of the resistor layer 94 may be modulated by the modulation portion 90.

In some embodiments, the electrical resistance of the resistor layer 94 may range from about 1 ohm to about 1000 ohm. The surface roughness of the interface between the resistor layer 94 and the modulation portion 90 may range from about 5 nm to about 100 nm. In some embodiments, the dopant in the modulation portion 90 includes small atoms that may fill the gaps/voids within the modulation portion 90 to provide a smooth deposition surface for the resistor layer 94. In some embodiments, the dopant in the modulation portion 90 includes large atoms that may increase the roughness of the deposition surface. As described above, the modulation portion 90 is utilized to change the crystallinity, or bonding structure, of the resistor layer 94, thereby modulating the electrical resistance of the as-formed resistor layer 94.

The mask layer 96 includes a dielectric material, such as silicon nitride. The mask layer 96 may be formed by any suitable method, such as CVD or ALD. In some embodiments, the mask layer 96 is a conformal layer formed by ALD.

Figure 9:
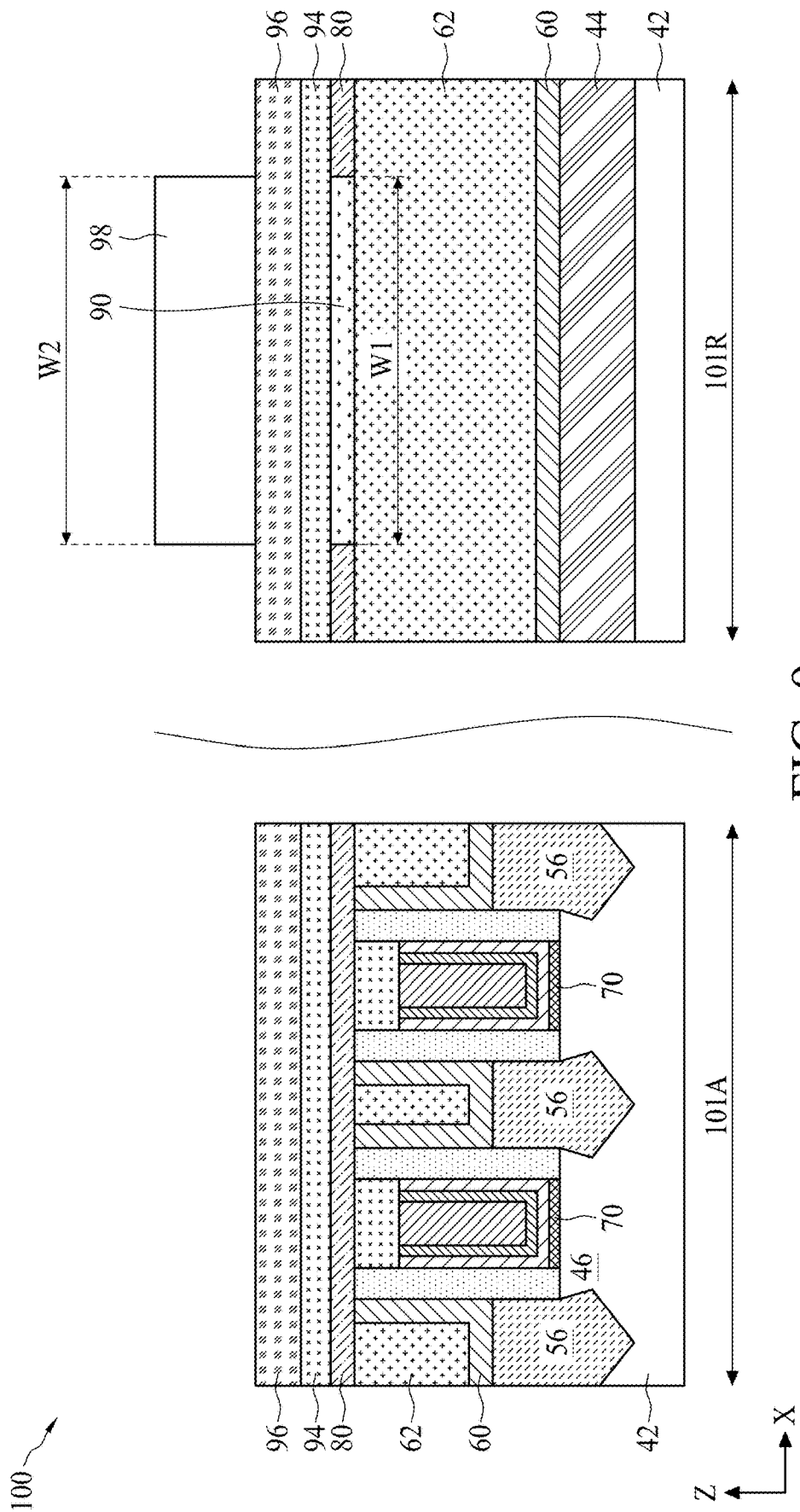
Figure 10:
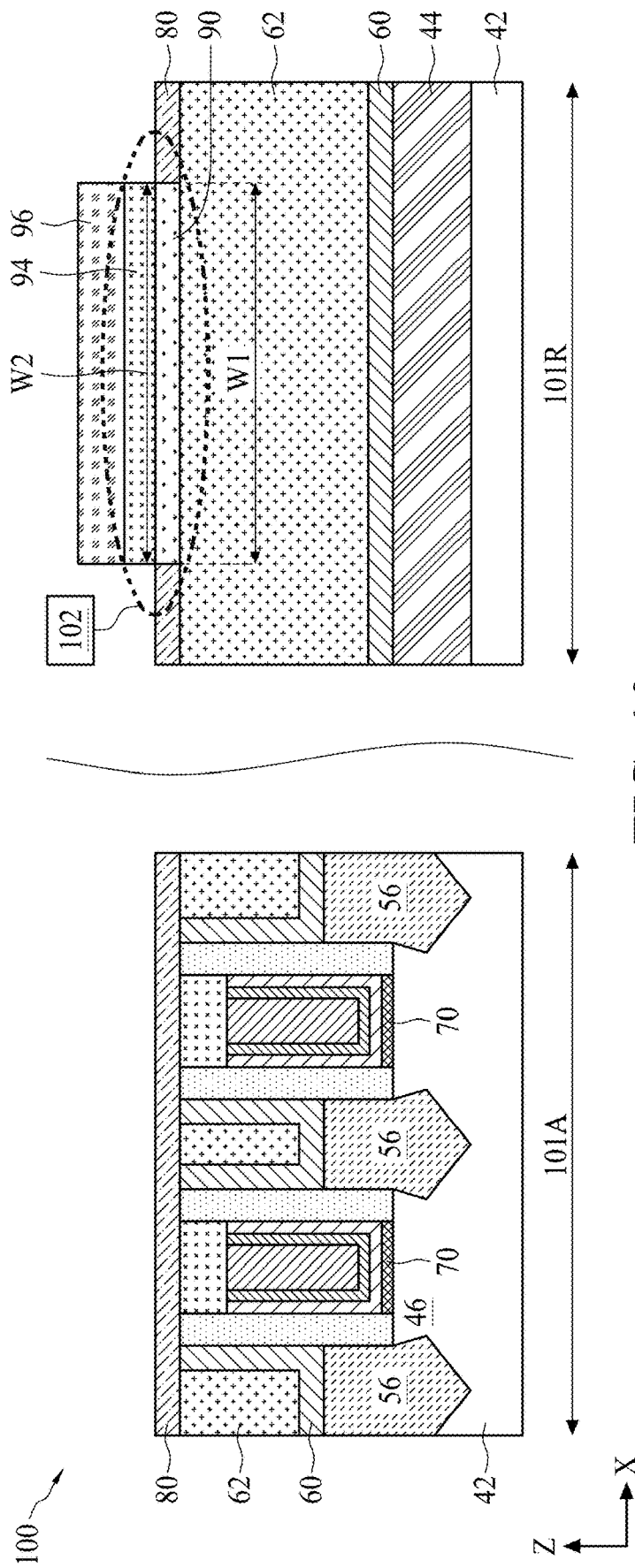
Figures 3, 10:
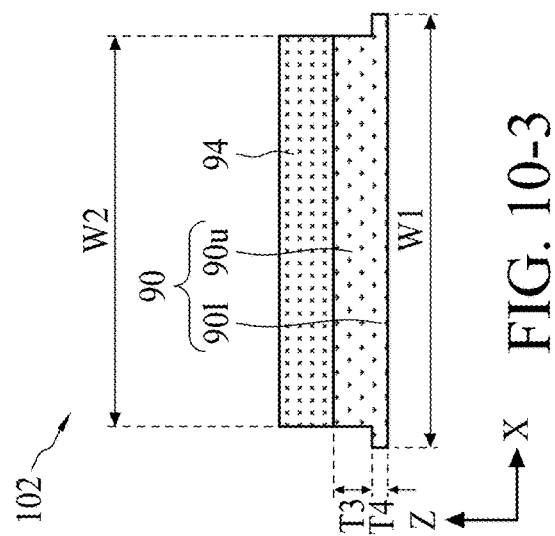
Figures 2, 10:
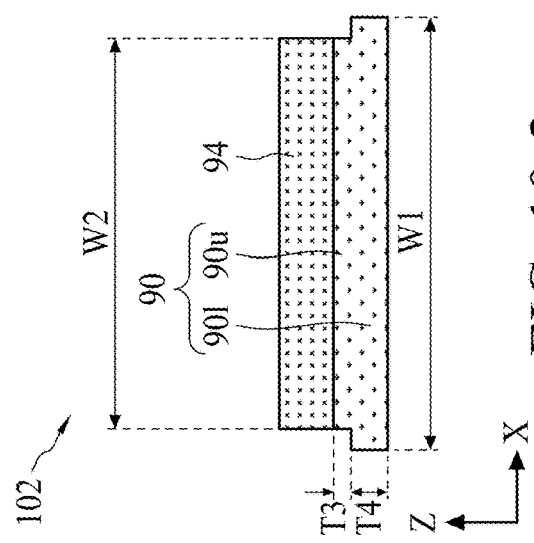
Figures 1, 10:
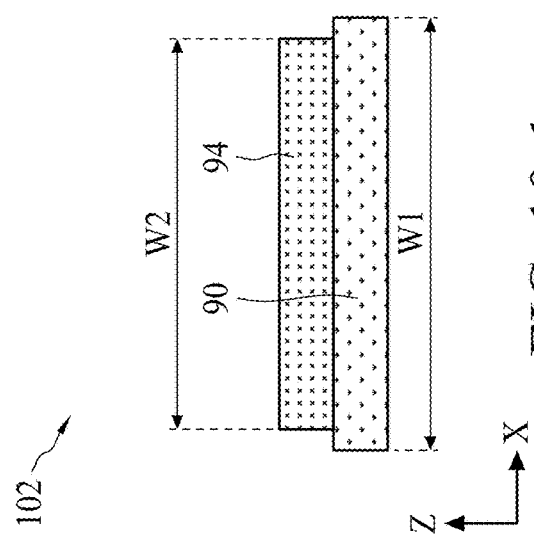

As shown in FIG. 9, a patterned mask layer 98 is formed on the mask layer 96 over the modulation portion 90 of the dielectric layer 80 in the resistor region 101R. The patterned mask layer 98 may be a photoresist layer. In some embodiments, the modulation portion 90 has a width W1 in the x-axis, and the patterned mask layer 98 has a width W2 in the x-axis. The width W2 may be the same or less than the width W1. As shown in FIG. 10, the portions of the mask layer 96 and the resistor layer 94 not covered by the patterned mask layer 98 are removed by one or more removal processes, such as one or more etch processes. In some embodiments, a portion of the dielectric layer 80 disposed under the removed portions of the resistor layer 94 may be removed, and the thickness of the portion of the dielectric layer 80 in the active region 101A may be substantially less than the thickness of the modulation portion 90. In some embodiments, the dielectric layer 80 is not affected by the one or more removal processes. As a result of the one or more removal processes, the remaining resistor layer 94 and the mask layer 96 are disposed over the modulation portion 90, and the other portions of the dielectric layer 80 are exposed.

After removing the portions of the mask layer 96 and the resistor layer 94 not covered by the patterned mask layer 98, the patterned mask layer 98 is removed by any suitable process. The mask layer 96 protects the resistor layer 94 during the removal of the patterned mask layer 98. In some embodiments, a portion of the mask layer 96 may be removed during the process to remove the patterned mask layer 98. In some embodiments, an annealing process is performed after removing the portions of the mask layer 96 and the resistor layer 94 to prevent permanent damage to the resistor layer 94.

In some embodiments, the resistor layer 94 has the width W2 that is substantially the same as the width W1 of the modulation portion 90, as shown in FIG. 10. FIGS. 10-1 to 10-3 show an enlarged portion 102 of the semiconductor device structure 100 of FIG. 10. In some embodiments, the width W2 of the resistor layer 94 is substantially less than the width W1, as shown in FIG. 10-1. Furthermore, in some embodiments, a portion of the modulation portion 90 is removed by the one or more removal processes. As a result, the modulation portion 90 includes an upper portion 90$u$ and a lower portion 90$l$ having different widths. In some embodiments, as shown in FIG. 10-2, the upper portion 90$u$ has the width W2 and a thickness T3, and the lower portion 90$l$ has the width W1 substantially greater than the width W2 and a thickness T4 substantially greater than the thickness T3. In some embodiments, as shown in FIG. 10-3, the upper portion 90$u$ has the width W2 and the thickness T3, and the lower portion 90$l$ has the width W1 substantially greater than the width W2 and the thickness T4 substantially less than the thickness T3.

Figure 11:
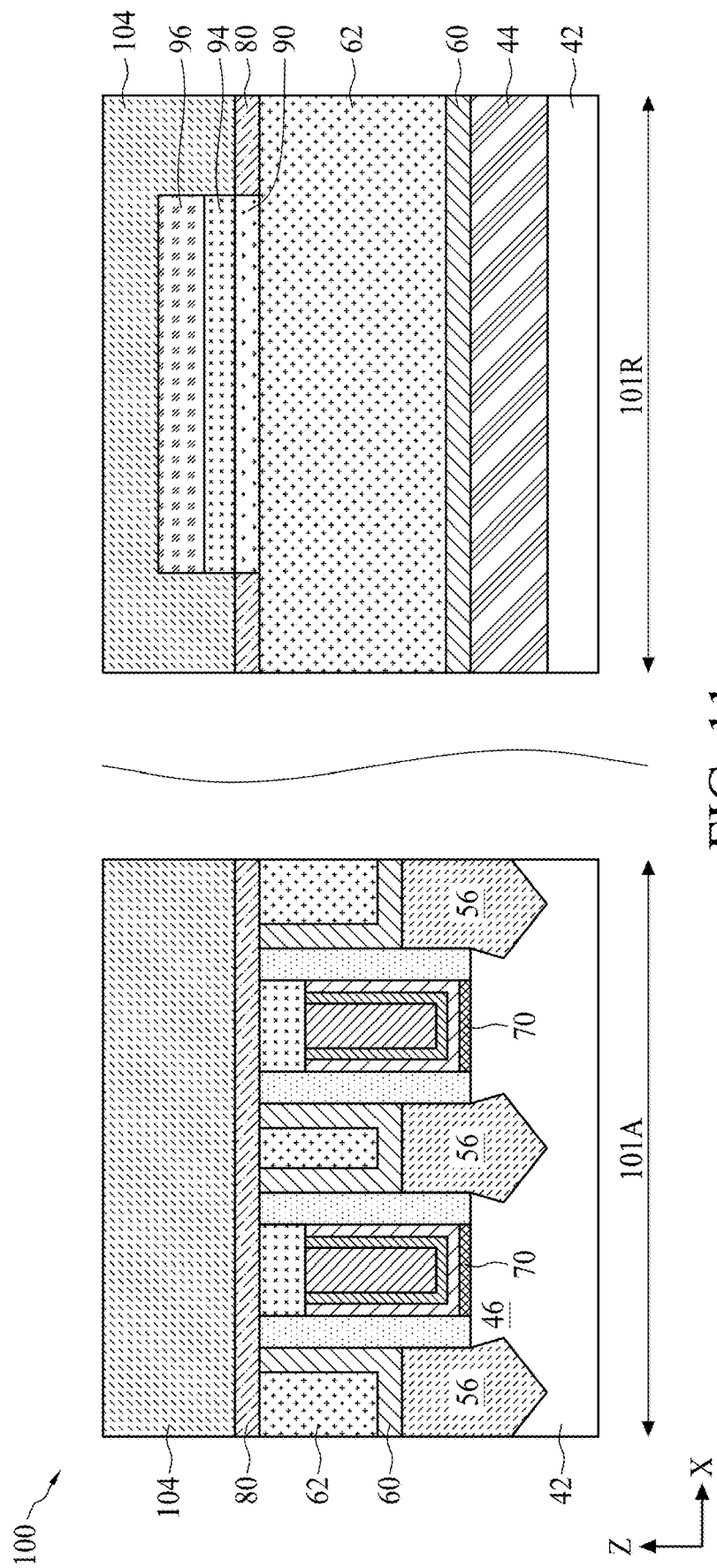

As shown in FIG. 11, a dielectric layer 104 is formed on the dielectric layer 80 in the active region 101A and on the dielectric layer 80, the sidewalls of the resistor layer 94 and the mask layer 96, and on the mask layer 96 in the resistor region 101R. The dielectric layer 104 may include the same material as the dielectric layer 80. In some embodiments, the dielectric layer 104 includes a plasma enhanced oxide, such as silicon oxide. In some embodiments, the dielectric layer 104 is also formed on the lower portion 90$l$ of the modulation portion 90 shown in FIGS. 10-2 and 10-3. The dielectric layer 104 may be a second ILD.

Figure 12:
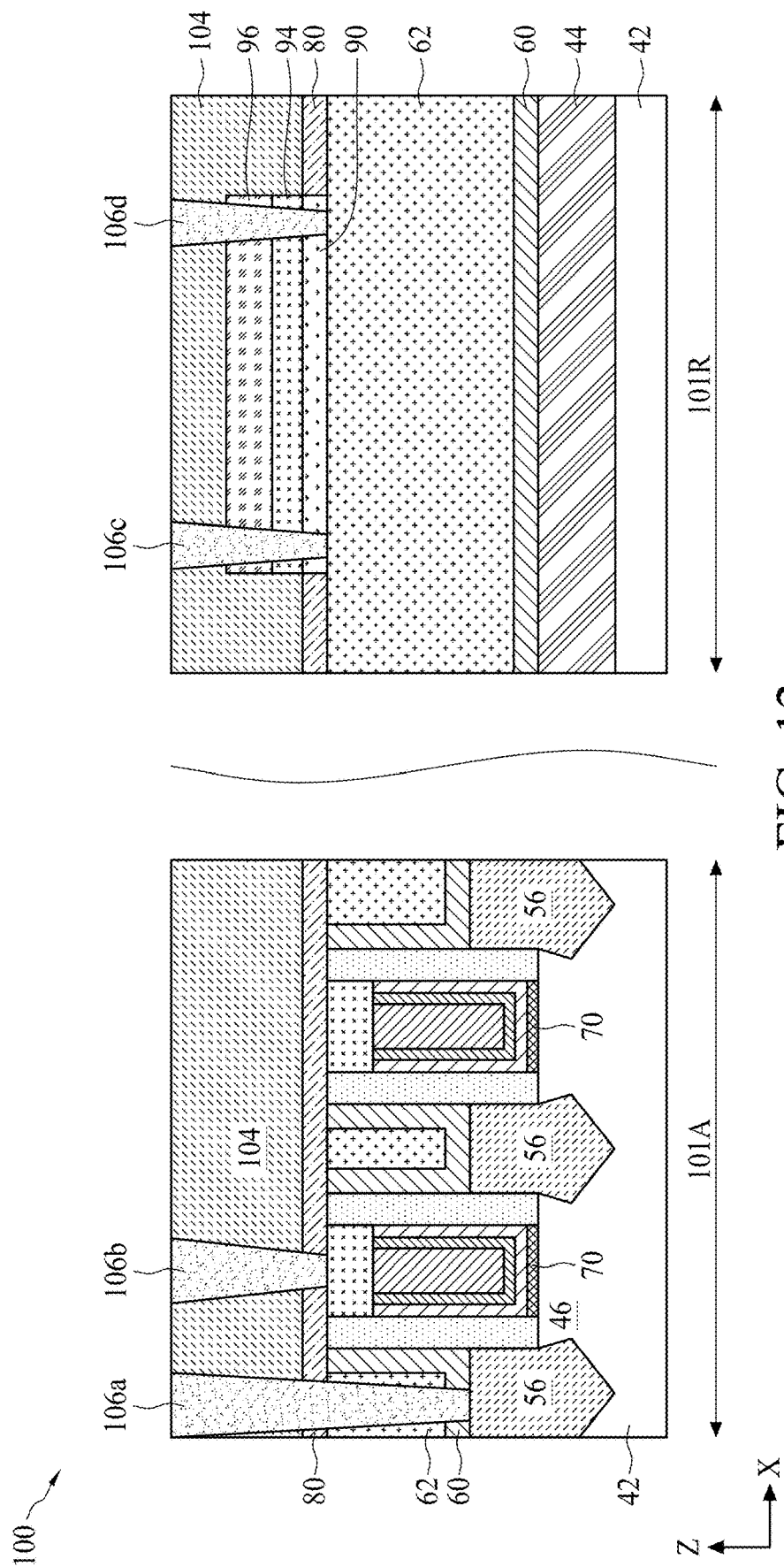
Figure 13:
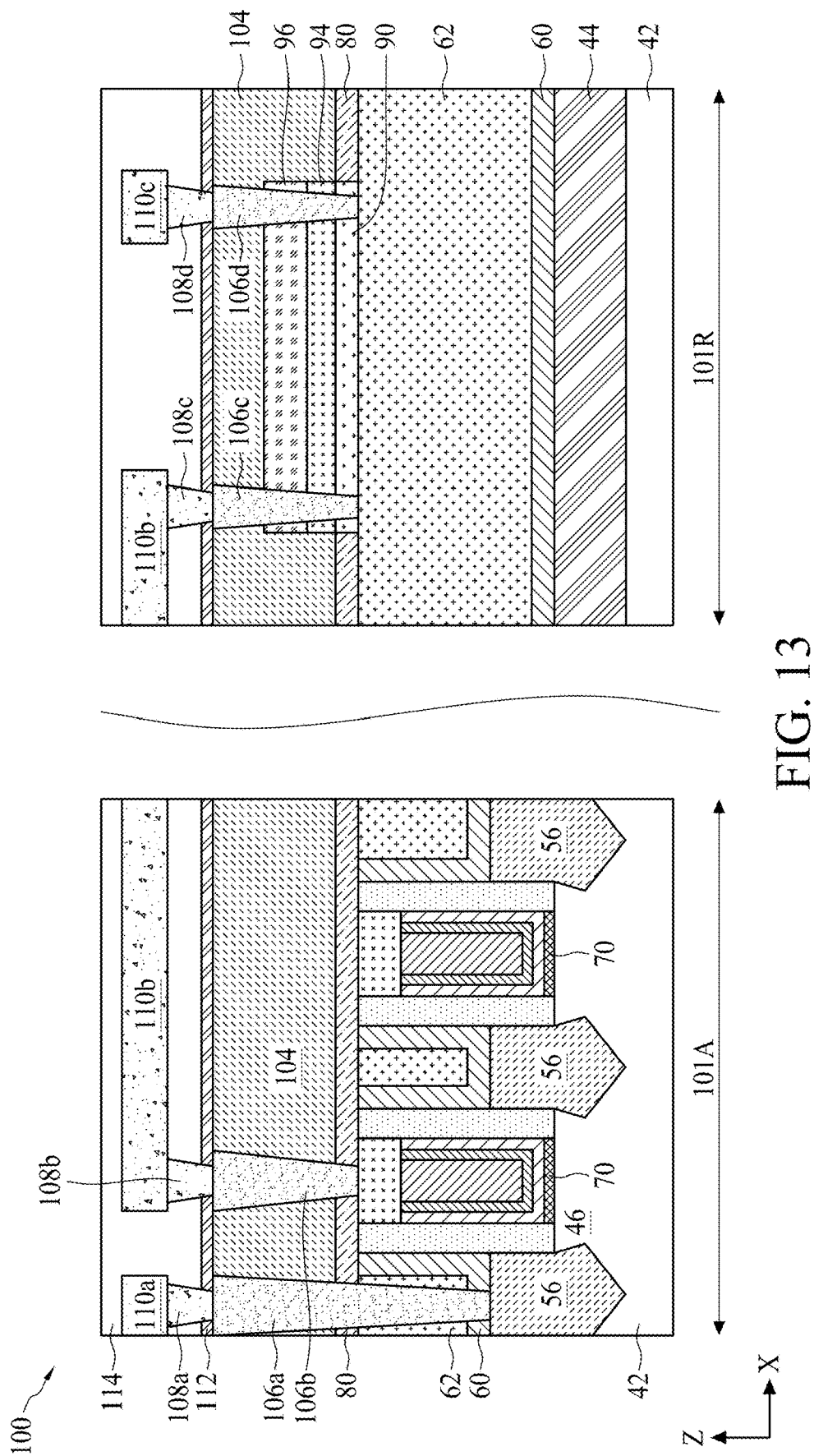

As shown in FIG. 12, conductive features 106$a$, 106$b$, 106$c$, 106$d$ are formed in the dielectric layer 104. The conductive features 106$a$, 106$b$, 106$c$, 106$d$ may include any electrically conductive material, such as a metal. In some embodiments, the conductive features 106$a$, 106$b$, 106$c$, 106$d$ includes W, Co, Ru, Cu, or other suitable metal. In some embodiments, the conductive feature 106$a$ is formed through the dielectric layer 104, the dielectric layer 80, the first ILD 62, and the CESL 60, and the conductive feature 106$a$ is electrically connected to the epitaxy source/drain region 56. A silicide layer (not shown) may be formed between the conductive feature 106$a$ and the source/drain region 56. The conductive feature 106$b$ is formed through the dielectric layer 104 and the dielectric layer 80, and the conductive feature 106$b$ is electrically connected to the gate conductive fill material 76. The conductive features 106$c$, 106$d$ are formed through the dielectric layer 104, the mask layer 96, the resistor layer 94, and the modulation portion 90, and the conductive features 106$c$, 106$d$ are electrically connected to the resistor layer 94. The conductive features 106$c$, 106$d$ may extend through the modulation portion 90 and in contact with the first ILD 62, as shown in FIG. 13. In some embodiments, the conductive features 106$c$, 106$d$ do not extend through the modulation portion 90. In other words, the bottoms of the conductive features 106$c$, 106$d$ are located in the modulation portion 90 at a location between the top and bottom surfaces of the modulation portion 90. In some embodiments, the conductive features 106$c$, 106$d$ are also formed in the first ILD 62, such as in the top portion of the first ILD 62.

As shown in FIG. 13, an etch stop layer 112 is formed on the dielectric layer 104 and a dielectric layer 114 is formed on the etch stop layer 112. The dielectric layer 114 may be an intermetal dielectric (IMD). Conductive vias 108$a$, 108$b$, 108$c$, 108$d$ are formed in the dielectric layer 114 and the etch stop layer 112 and are in contact with the conductive features 106$a$, 106$b$, 106$c$, 106$d$, respectively. Conductive lines 110$a$, 110$b$, 110$c$ are formed in the dielectric layer 114. In some embodiments, the conductive line 110$a$ is in contact with the conductive via 108$a$, the conductive line 110$b$ is in contact with the conductive vias 108$b$, 108$c$, and the conductive line 110$c$ is in contact with the conductive via 108$d$. The conductive vias 108$a$-$d$ and the conductive lines 110$a$-$c$ may include any suitable electrically conductive material, such as a metal. In some embodiments, the conductive vias 108$a$-$d$ and the conductive lines 110$a$-$c$ include Cu, Co, W, Ru, or other suitable metal.

Figure 14:
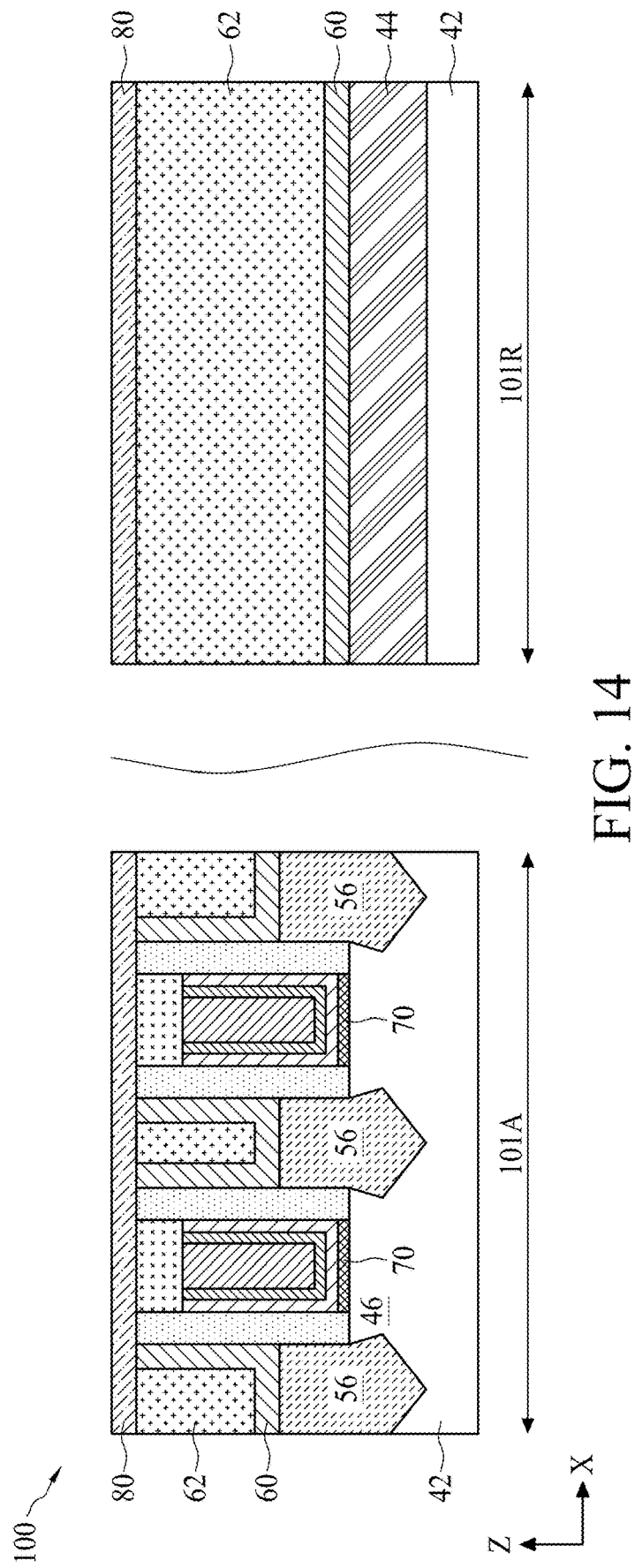
FIGS. 14-16 are cross-sectional side views of various stages of manufacturing the semiconductor device structure of FIG. 1 taken along cross-section A-A, in accordance with alternative embodiments.
Figure 15:
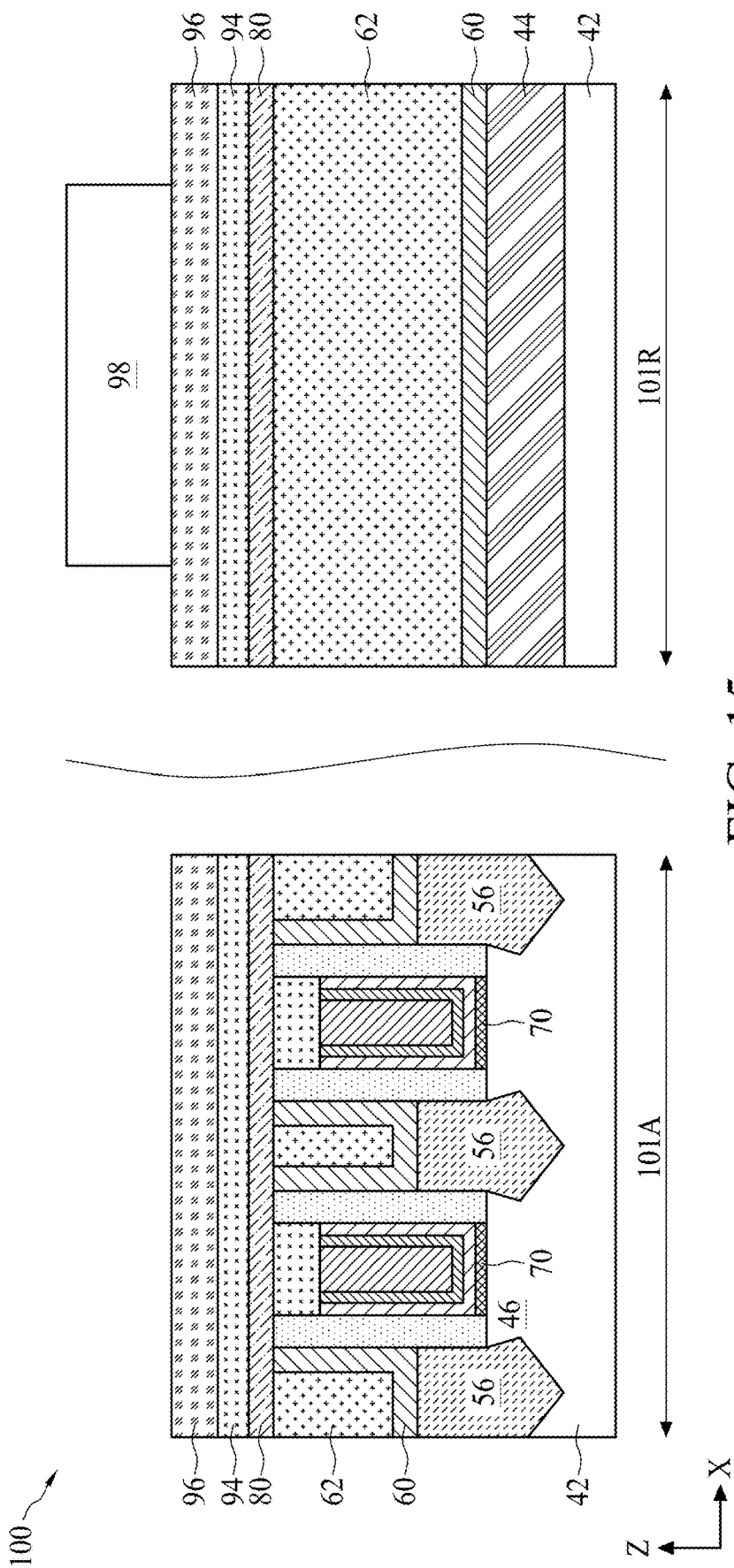
Figure 16:
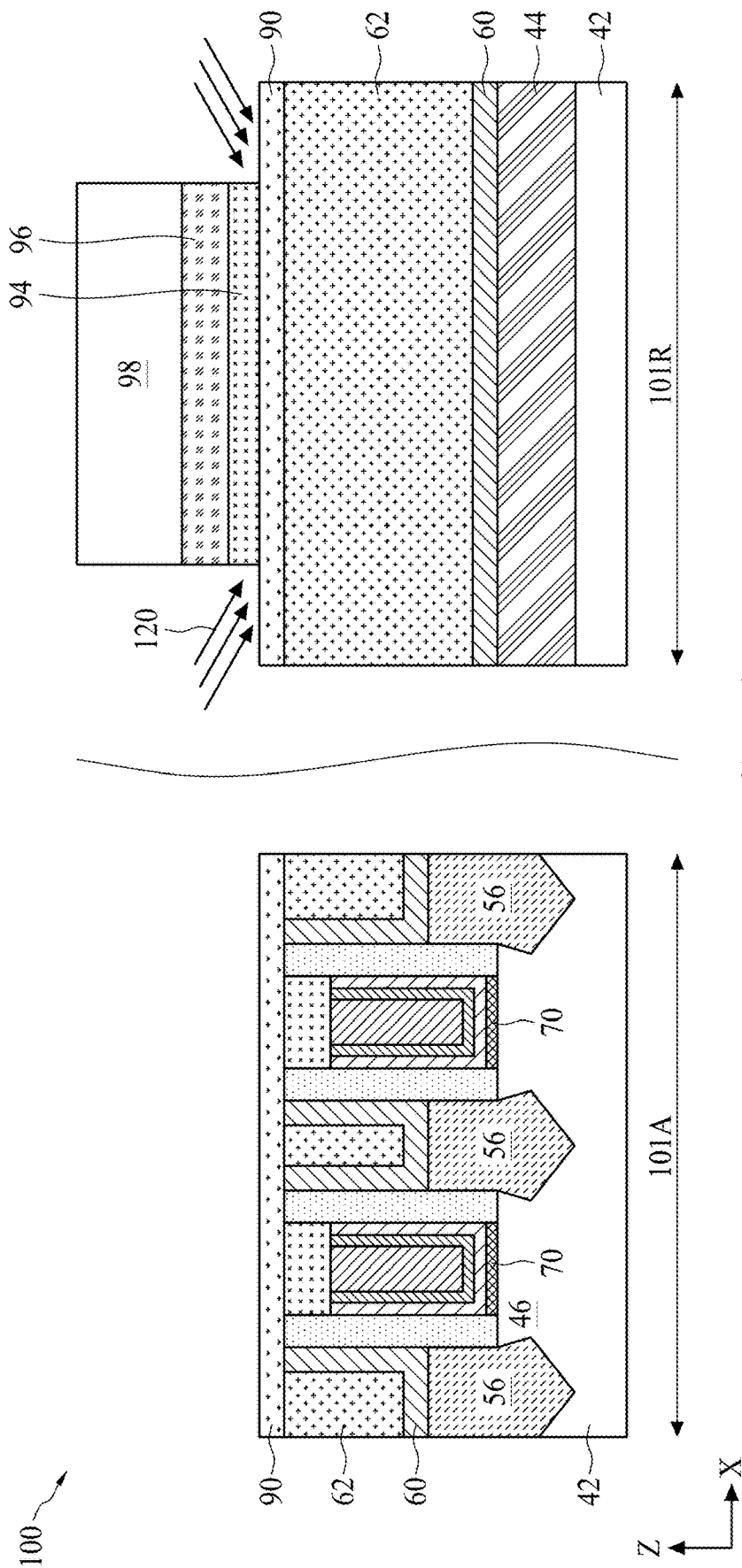

FIGS. 14-16 are cross-sectional side views of various stages of manufacturing the semiconductor device structure 100 of FIG. 1 taken along cross-section A-A, in accordance with alternative embodiments. As shown in FIG. 14, the dielectric layer 80 is formed over the first ILD 62, CESL 60, gate spacers 54, and replacement gate structures in the active region 101A and over the first ILD 62 in the resistor region 101R. Next, instead of forming the modulation portion 90, the resistor layer 94, the mask layer 96, and the patterned mask layer 98 are formed, as shown in FIG. 15. The resistor layer 94 and the mask layer 96 are formed in the active region 101A and the resistor region 101R, and the patterned mask layer 98 are formed on a portion of the mask layer 96 in the resistor region 101R. As shown in FIG. 16, portions of the mask layer 96 and resistor layer 94 are removed by one or more etch processes, and an implantation process 120 is performed. The implantation process 120 may be angled so the portion of the dielectric layer 80 located under the resistor layer 94 is implanted with a dopant. The dopant may be the same as the dopant of the implantation process 88 described in FIG. 7. In some embodiments, the portion of the dielectric layer 80 located in the active region 101A is also implanted with the dopant, and the dielectric layer 80 becomes a modulation layer 90. The modulation layer 90 may include the same material as the modulation portion 90. In some embodiments, a mask (not shown) is formed on the dielectric layer 80 in the active region 101A, and the portion of the dielectric layer 80 located in the resistor region 101R becomes the modulation portion 90. Thus, in some embodiments, the portion of the dielectric layer 80 located in the active region 101A has a first oxygen to silicon ratio, and the modulation portion 90 of the dielectric layer 80 located in the resistor region 101R has a second oxygen to silicon ratio different from the first oxygen to silicon ratio. In some embodiments, the portion of the dielectric layer 80 located in the active region 101A is dopant free, and the modulation portion 90 of the dielectric layer 80 located in the resistor region 101R includes a dopant.

After the implantation process 120, an annealing process is performed to change the crystallinity of the resistor layer 94. In some embodiments, the annealing process is performed in an inert environment, such as in nitrogen environment. The annealing temperature may range from about 100 degrees Celsius to about 1000 degrees Celsius. The annealing process and the modulation portion 90 help to rearrange the crystal structure of the resistor layer 94, so the electrical resistance of the resistor layer 94 can be modulated. If the modulation portion 90 (or the modulation layer) is not formed, and the resistor layer 94 is located on the dielectric layer 80, the annealing process does not substantially affect the crystal structure of the resistor layer 94. After the annealing process, the patterned mask layer 98 is removed, and subsequent processes, such as the processes described in FIGS. 11 to 13 are performed.

Figure 17:
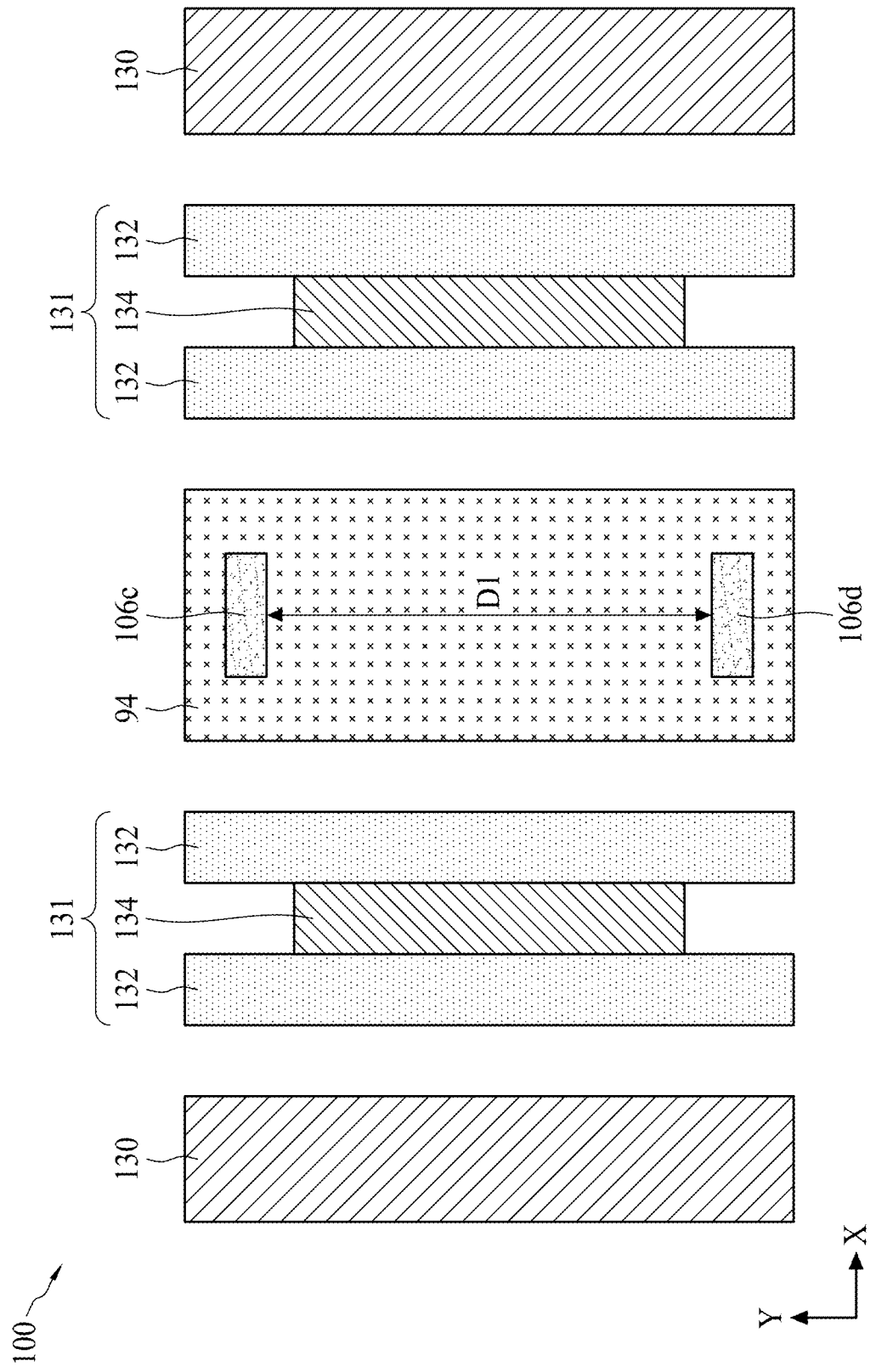
FIGS. 17-20 are schematic top views of a resistor layer, in accordance with some embodiments.

FIGS. 17-20 are schematic top views of the resistor layer 94 and components adjacent to the resistor layer 94, in accordance with some embodiments. The components shown in FIGS. 17-20 are to illustrate the arrangements of the components in the x-y plane, and the components are not aligned in the z-axis. In other words, the components shown in FIGS. 17-20 are not located at the same level along the z-axis. As shown in FIG. 17, the resistor layer 94 has a length along the y-axis and a width along the x-axis. In some embodiments, the ratio of the length to the width is substantially greater than 1, such as from about 1 to about 1000. In some embodiments, the length of the resistor layer 94 ranges from about 0.2 microns to about 500 microns. The modulation portion 90 may include the same length and width as the resistor layer 94. The conductive features 106c, 106d are in contact with the resistor layer 94, and a distance D1 is between the conductive features 106c, 106d. In some embodiments, the distance D1 ranges from about 0.1 microns to about 500 microns.

In some embodiments, the conductive features 106c, 106d are arranged along the x-axis, as shown in FIG. 12, and the ratio of the length to the width of the resistor layer 94 is substantially less than 1. In some embodiments, the width of the resistor layer 94 ranges from about 0.2 microns to about 500 microns. The modulation portion 90 may include the same length of width as the resistor layer 94.

As shown in FIG. 17, the resistor layer 94 is disposed between two dummy structures 131. Each dummy structure 131 includes two dummy gate stacks 132 and a dummy source/drain region 134 disposed between the two dummy gate stacks 132. The two dummy structures 131 are disposed between two dummy resistor layers 130. Each resistor layer 130 may include the same material as the resistor layer 94 and may be formed by the same process as the resistor layer 94. The dummy structures 131 and the dummy resistor layer 130 are not functional in a device and are formed to balance the different materials formed over the semiconductor substrate 42 to avoid issues like dishing caused by CMP process.

Figure 18:
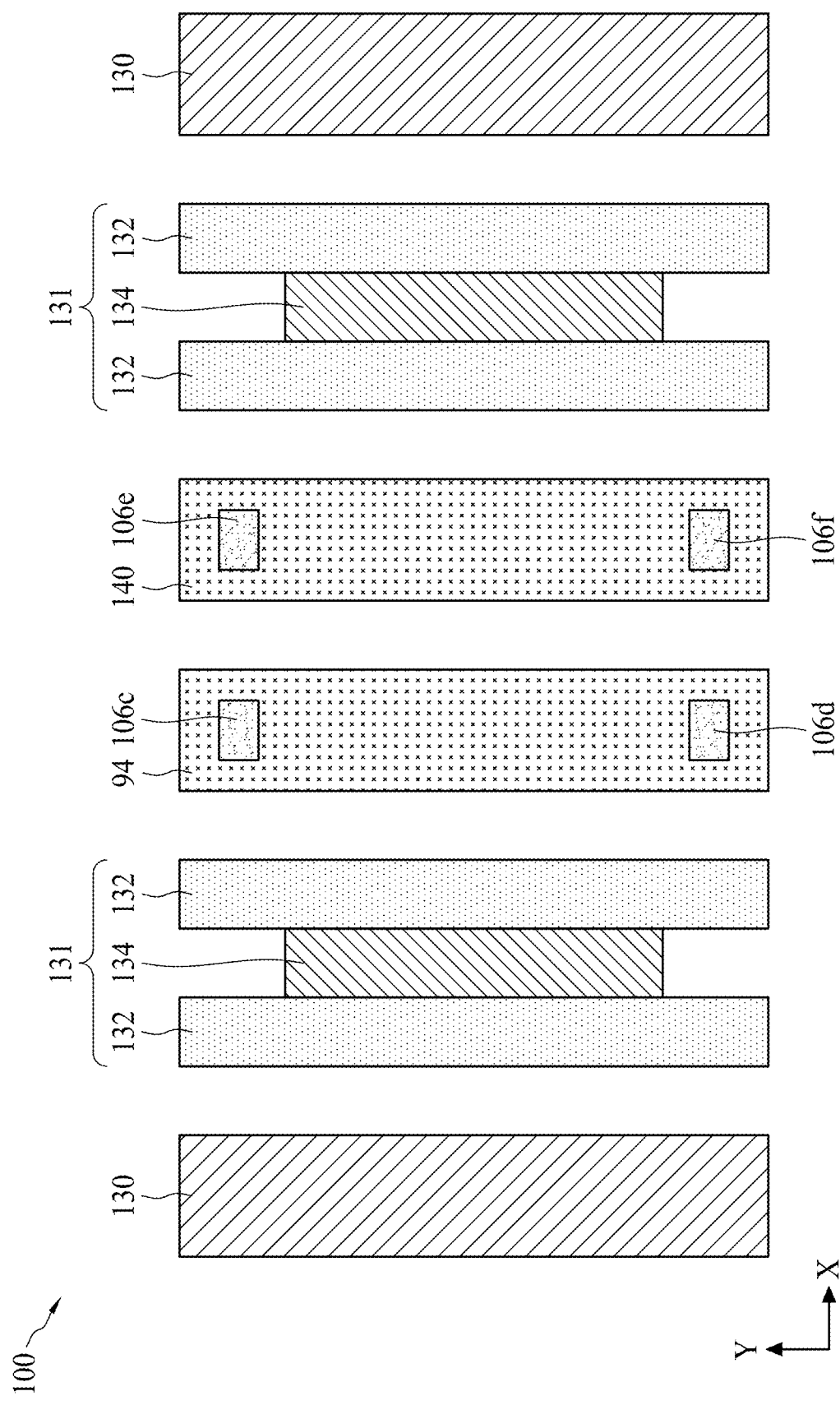

As shown in FIG. 18, instead of having one resistor layer 94 disposed between the dummy structures 131, two resistor layers 94, 140 are disposed between the dummy structures 131. The resistor layer 140 may include the same material as the resistor layer 94 and formed by the same process as the resistor layer 94. Conductive features 106e, 106f are in contact with the resistor layer 140, and the conductive features 106e, 106f may include the same material as the conductive feature 106c and formed by the same process as the conductive feature 106c.

Figure 19:
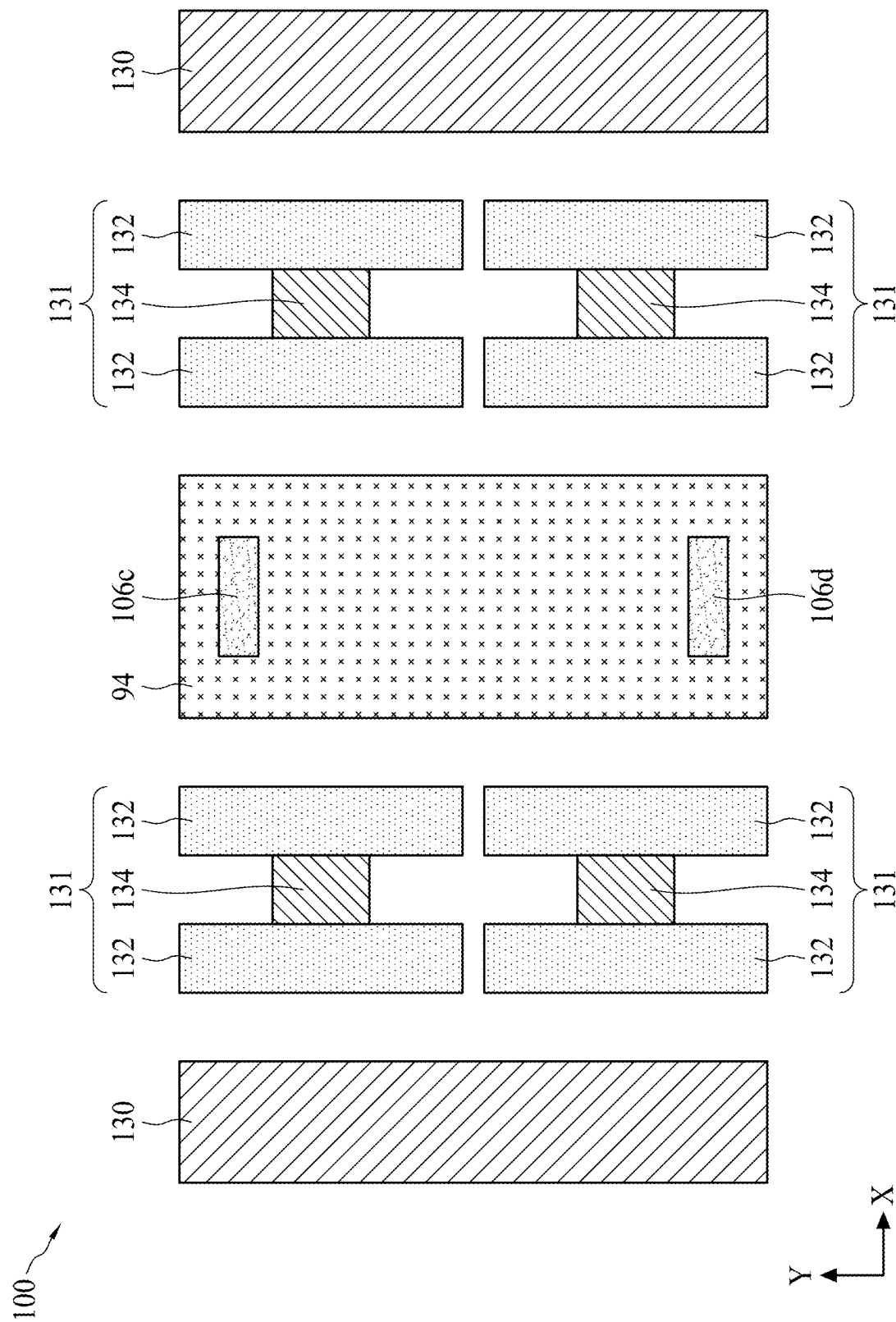
Figure 20:
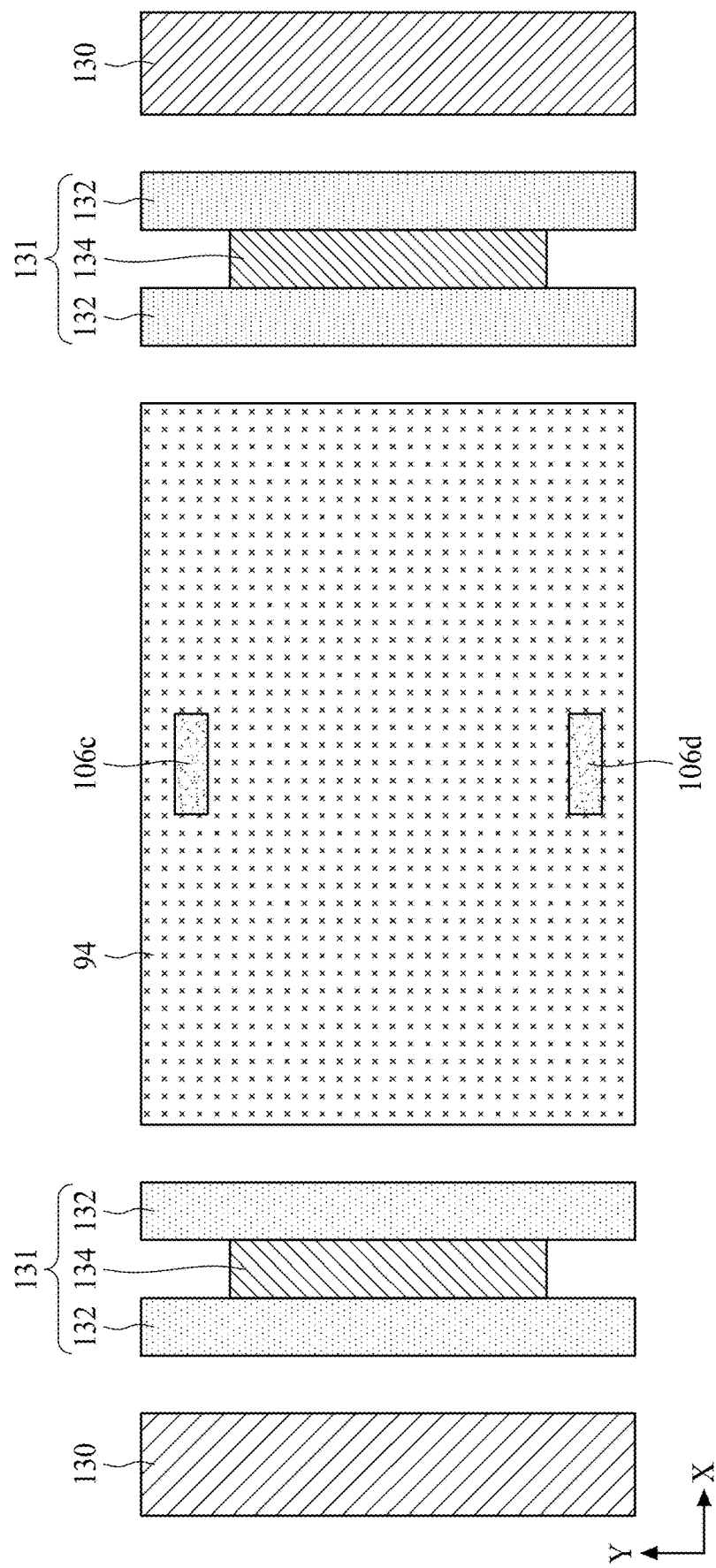

As shown in FIG. 19, each dummy structure 131 is divided into two dummy structures 131 along the y-axis. As a result, the resistor layer 94 is disposed between four dummy structures 131. As shown in FIG. 20, the width of the resistor layer 94 is substantially greater than the length of the resistor layer 94, and a ratio of the length to the width ranges from about 0.001 to about 1. The layouts of the resistor layer 94 and the components around the resistor layer 94 shown in FIGS. 17 to 20 may be combined in any suitable manner. In some embodiments, the resistor layer 94 is used in circuits such as a low-dropout regulator (LDO) circuit or CODEC. The circuit may have a size ranging from about 0.1 mm by 0.1 mm to about 25 mm by 25 mm.

Figures 21A, 21B:
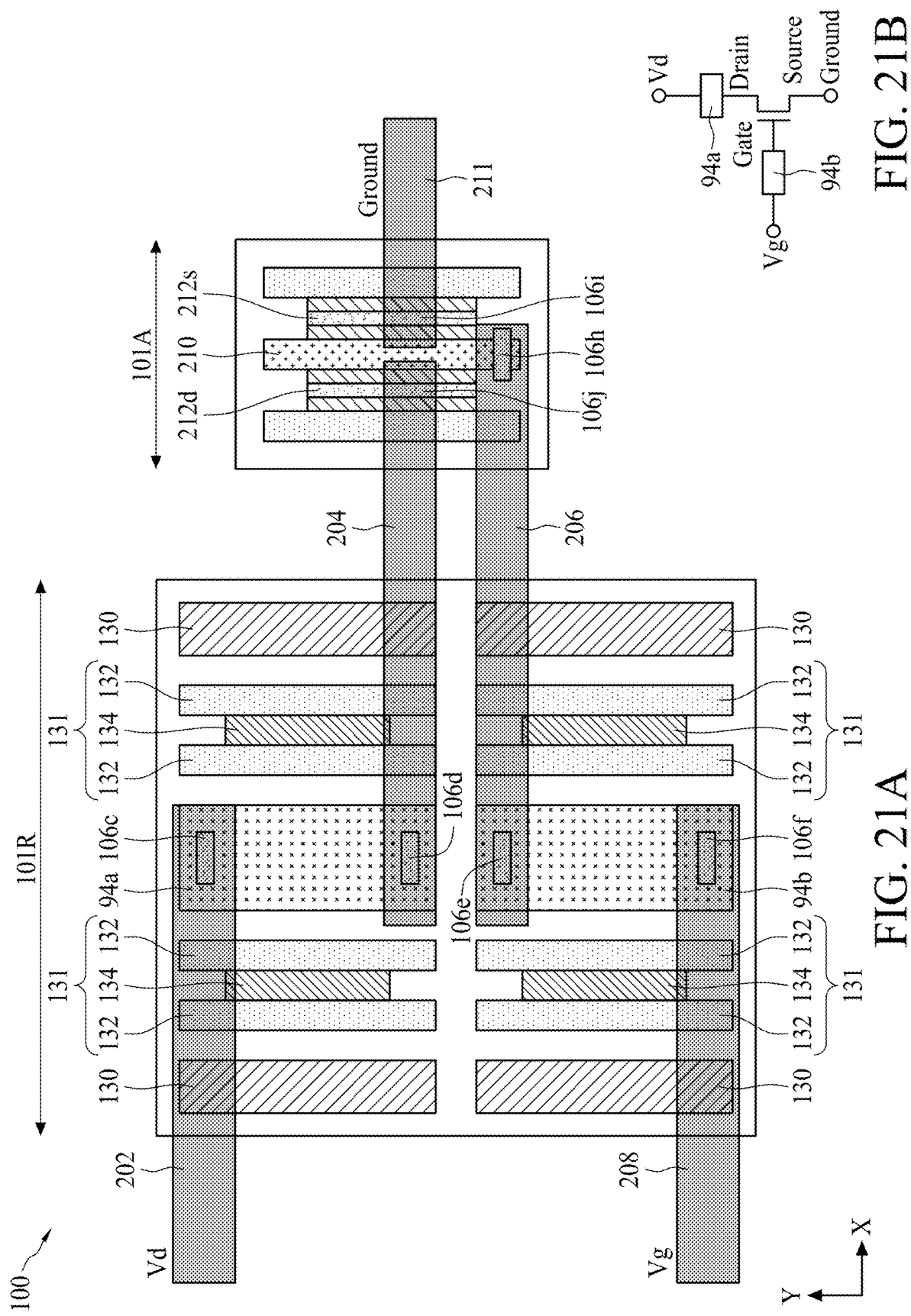
FIGS. 21A and 21B illustrate a device including the resistor layer, in accordance with some embodiments.

FIGS. 21A and 21B illustrate a device including the resistor layer 94, in accordance with some embodiments. As shown in FIGS. 21A and 22B, a first resistor layer 94a is electrically connected to the Vd via the conductive features 202, 106c and is electrically connected to a drain region 212d via the conductive features 106d, 204, 106j. A second resistor layer 94b is electrically connected to the Vg via the conductive features 208, 106f and is electrically connected to a gate 210 via the conductive features 106e, 206, 106h. A source region 212s is electrically connected to the ground via the conductive features 106i, 211. The gate 210, the source region 212s, and the drain region 212d may be located in the active region 101A, and the resistor layers 94a, 94b are located in the resistor region 101R.

The present disclosure in various embodiment provide the semiconductor device structure 100 and the methods of forming the same. In some embodiments, the semiconductor device structure 100 includes a dielectric layer 80 having a modulation portion 90 and a resistor layer 94 disposed on the modulation portion 90. The modulation portion 90 includes different composition compared to the rest of the dielectric layer 80. Some embodiments may achieve advantages. For example, the modulation portion 90 may be utilized to modulate the electrical resistance of the resistor layer 94 by implanting a dopant into the modulation portion 90. The modulation portion 90 changes the crystallinity of the resistor layer 94, leading to increased or decreased electrical resistance of the resistor layer 94.

An embodiment is a semiconductor device structure. The structure includes a first dielectric layer including a first portion disposed over a source/drain region in an active region of a substrate and a modulation portion over an interlayer dielectric (ILD) in a resistor region of the substrate, the first portion of the first dielectric layer has a first composition, and the modulation portion of the first dielectric layer has a second composition different from the first composition. The structure further includes a resistor layer disposed on the modulation portion of the first dielectric layer in the resistor region and a second dielectric layer disposed over the first dielectric layer in the active region and over the resistor layer in the resistor region.

Another embodiment is a semiconductor device structure. The structure includes a first dielectric layer including a first portion disposed in an active region of a substrate and a modulation portion in a resistor region of the substrate, the first portion of the first dielectric layer has a first composition, and the modulation portion of the first dielectric layer has a second composition different from the first composition. The structure further includes a resistor layer disposed on the modulation portion of the first dielectric layer in the resistor region, a mask layer disposed on the resistor layer in the resistor region, and a second dielectric layer disposed on the first dielectric layer in the active region and on the mask layer in the resistor region. The second dielectric layer is in contact with sidewalls of the resistor layer and the mask layer.

A further embodiment is a method. The method includes forming a first dielectric layer over a source/drain region in an active region and over an interlayer dielectric (ILD) in the resistor region, forming a first mask layer on the first dielectric layer, and a portion of the first dielectric layer in the resistor region is exposed. The method further includes performing an implantation process to implant a dopant into the exposed portion of the first dielectric layer to form a modulation portion in the resistor region, forming a resistor layer on the first dielectric layer in the active region and on the modulation portion in the resistor region, forming a second mask layer on the resistor layer, removing portions of the resistor layer and second mask layer disposed in the active region to expose a portion of the first dielectric layer, and forming a second dielectric layer on the exposed portion of the first dielectric layer in the active region and on the second mask layer in the resistor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    forming a first dielectric layer over a source/drain region in an active region and over an interlayer dielectric (ILD) in a resistor region;
    forming a first mask layer on the first dielectric layer, wherein a portion of the first dielectric layer in the resistor region is exposed;
    performing an implantation process to implant a dopant into the exposed portion of the first dielectric layer to form a modulation portion in the resistor region;
    forming a resistor layer on the first dielectric layer in the active region and on the modulation portion in the resistor region;
    forming a second mask layer on the resistor layer;
    removing portions of the resistor layer and second mask layer disposed in the active region to expose a portion of the first dielectric layer; and
    forming a second dielectric layer on the exposed portion of the first dielectric layer in the active region and on the second mask layer in the resistor region.

2. The method of claim 1, further comprising forming conductive features in the second mask layer, the resistor layer, and the modulation portion of the first dielectric layer.

3. The method of claim 2, wherein the removing portions of the resistor layer and second mask layer disposed in the active region also removes a portion of the first dielectric layer.

4. The method of claim 2, wherein the removing portions of the resistor layer and second mask layer disposed in the active region also removes a portion of the modulation portion.

5. The method of claim 1, further comprising forming a patterned mask layer on the second mask layer, wherein a width of the patterned mask layer is substantially the same or less than a width of the modulation portion.

6. A method, comprising:
    depositing a first dielectric layer over an interlayer dielectric (ILD);
    depositing a mask layer on the first dielectric layer;
    forming an opening in the mask layer to expose a first portion of the first dielectric layer;
    introducing a dopant into the exposed first portion of the first dielectric layer to form a modulation portion;
    removing the mask layer to expose a second portion of the first dielectric layer;
    depositing a resistor layer on the second portion of the first dielectric layer and on the modulation portion;
    removing portions of the resistor layer to expose the second portion of the first dielectric layer; and
    depositing a second dielectric layer on the exposed second portion of the first dielectric layer and over the resistor layer.

7. The method of claim 6, wherein the first dielectric layer is disposed over a gate structure and a source/drain region.

8. The method of claim 7, wherein the second portion of the first dielectric layer is disposed over the gate structure and the source/drain region.

9. The method of claim 8, wherein the second dielectric layer is disposed over the gate structure and the source/drain region.

10. The method of claim 6, wherein the introducing the dopant is performed by an implantation process.

11. The method of claim 6, wherein the introducing the dopant is performed by depositing a dopant-rich layer on the exposed first portion of the first dielectric layer and diffusing the dopant from the dopant-rich layer into the first portion of the first dielectric layer.

12. The method of claim 6, wherein the dopant is introduced through a portion of a thickness of the first portion of the first dielectric layer.

13. The method of claim 6, wherein the dopant is introduced through an entire thickness of the first portion of the first dielectric layer.

14. A method, comprising:
    depositing a first dielectric layer over an interlayer dielectric (ILD);
    introducing a dopant into a first portion of the first dielectric layer to form a modulation portion;
    depositing a resistor layer on a second portion of the first dielectric layer and on the modulation portion;
    depositing a first mask layer on the resistor layer;
    removing portions of the first mask layer and portions of the resistor layer to expose the second portion of the first dielectric layer; and
    depositing a second dielectric layer on the exposed second portion of the first dielectric layer and on the first mask layer.

15. The method of claim 14, wherein the removing the portions of the first mask layer and the portions of the resistor layer are performed by one or more etch processes.

16. The method of claim 15, wherein the one or more etch processes remove portions of the modulation portion.

17. The method of claim 14, wherein the second dielectric layer is in contact with sidewalls of the resistor layer and sidewalls of the first mask layer.

18. The method of claim 14, further comprising depositing a second mask layer on the first dielectric layer and forming an opening in the second mask layer to expose the first portion of the first dielectric layer.

19. The method of claim 18, further comprising removing the second mask layer after the introducing of the dopant into the first portion of the first dielectric layer.

20. The method of claim 14, further comprising forming a conductive feature through the first mask layer, the resistor layer, and into the modulation portion.

* * * * *